United States Patent
Chauhan et al.

(10) Patent No.: US 9,817,929 B1
(45) Date of Patent: Nov. 14, 2017

(54) FORMAL VERIFICATION USING MICROTRANSACTIONS

(71) Applicant: Calypto Design Systems, Inc., San Jose, CA (US)

(72) Inventors: Pankaj P. Chauhan, San Ramon, CA (US); Sameer Kapoor, Milpitas, CA (US); Saurabh Jain, Noida (IN); Kunal Bindal, Munich (DE); Bryan D. Bowyer, Wilsonville, OR (US); Andres R. Takach, Wilsonville, OR (US); Peter P. Gutberlet, Wilsonville, OR (US); Gagandeep Singh, Noida (IN); Maheshinder Goyal, Noida (IN)

(73) Assignee: Calypto Design Systems, Inc., San Jose, CA (US)

( * ) Notice: Subject to any disclaimer, the term of this patent is extended or adjusted under 35 U.S.C. 154(b) by 66 days.

(21) Appl. No.: 14/664,763

(22) Filed: Mar. 20, 2015

Related U.S. Application Data

(60) Provisional application No. 62/007,852, filed on Jun. 4, 2014, provisional application No. 62/042,207, filed on Aug. 26, 2014.

(51) Int. Cl.
  *G06F 9/455* (2006.01)
  *G06F 17/50* (2006.01)

(52) U.S. Cl.
  CPC ........ *G06F 17/504* (2013.01); *G06F 17/5045* (2013.01)

(58) Field of Classification Search
  USPC ........................................ 716/107
  See application file for complete search history.

(56) References Cited

U.S. PATENT DOCUMENTS

| | | | |
|---|---|---|---|
| 6,711,534 B1 | 3/2004 | Parashkevov | |
| 7,350,168 B1 | 3/2008 | Mathur et al. | |
| 7,607,115 B1 | 10/2009 | Krishnaswamy et al. | |
| 2003/0131324 A1* | 7/2003 | Takenaka | G06F 17/504 716/103 |
| 2006/0271904 A1 | 11/2006 | Emerson et al. | |
| 2013/0047127 A1* | 2/2013 | Arunachalam | G06F 17/5072 716/103 |
| 2014/0040843 A1* | 2/2014 | Postman | G06F 17/5068 716/112 |

OTHER PUBLICATIONS

Aagaard et al., "A framework for microprocessor correctness statements," *CHARME*, pp. 433-448 (Sep. 2001).

(Continued)

*Primary Examiner* — Bryce Aisaka
(74) *Attorney, Agent, or Firm* — Klarquist Sparkman, LLP

(57) ABSTRACT

Disclosed herein are representative embodiments of methods, apparatus, and systems for performing formal verification of circuit descriptions. In certain example embodiments, the disclosed technology involves the formal verification of a register-transfer-level ("RTL") circuit description produced from a high level synthesis tool (e.g., a C++ or SystemC synthesis tool) relative to the original high level code from which the RTL description was synthesized (e.g., the original C++ or SystemC description) using sub-functional-call-level transactions.

32 Claims, 25 Drawing Sheets

(56) References Cited

OTHER PUBLICATIONS

Baumgartner et al., "Scalable Sequential Equivalence Checking Across Arbitrary Design Transformations," *Int'l Conf. on Computer Design*, 8 pp. (Oct. 2006).

Bjesse et al., "Automatic Generalized Phase Abstraction for Formal Verification," *IEEE Int'l Conf. on Computer-Aided Design*, pp. 1073-1079 (Nov. 2005).

Chauhan et al., "Non-cycle-accurate Sequential Equivalence Checking," *Proc. Of the 46th Annual Design Automation Conf.*, pp. 460-465 (Jul. 2009).

Clarke et al., "Behavioral Consistenency of C and Verilog Programs Using Bounded Model Checking," *Design Automation Conf.*, pp. 368-371 (Jun. 2003).

Clarke et al., *Model Checking*, MIT Press, Chapters 1 and 2, pp. 1-26 (2000).

Haldar et al., "Construction of Concrete Verification Models from C++," *Design Automation Conf.*, pp. 942-947 (Jun. 2008).

Huang et al., "AQUILA: An Equivalence Checking System for Large Sequential Designs," *IEEE Trans. On Computers*, vol. 49, No. 5, pp. 443-464 (May 2000).

Kaiss et al., "Industrial Strength SAT-Based Alignability Algorithm for Hardware Equivalence Verification," *Int'l Conf. on Formal Methods in Computer-Aided Design*, pp. 20-26 (Nov. 2007).

Khasidashvili et al., "Post-reboot Equivalence and Compositional Verification of Hardware," *Int'l Conf. on Formal Methods in Computer-Aided Design*, pp. 11-18 (Nov. 2006).

Koelbl et al., "Memory Modeling in ESL-RTL Equivalence Checking," *Design Automation Conf.*, pp. 205-209 (Jun. 2007).

Kuehlmann, "Dynamic Transition Relation Simplification for Bounded Property Checking," *Int'l Conf. on Computer-Aided Design*, pp. 50-57 (Nov. 2004).

Kuehlmann et al., "Robust Boolean Reasoning for Equivalence Checking and Functional Property Verification," *IEEE Trans. On Computer-Aided Design of Integrated Circuits and Systems*, vol. 21, No. 12, pp. 1377-1394 (Dec. 2002).

Lin, "Recent Developments in High-Level Synthesis," *ACM TODAES*, vol. 2, No. 1, pp. 2-21 (Jan. 1997).

Lu et al., "Sequential Equivalence Checking Based on $k^{th}$ Invariants and Circuit SAT Solving," *IEEE Int'l High-LevelDesign Validation and Test Workshop*, 7 pp. (Nov. 2005).

Mentor Graphics Corporation, "Sequential Equivalence Checking: A New Approach to Functional Verification of Datapath and Control Logic Changes," White Paper, 7 pp. (2007).

Mishchenko et al., "Scalable and Scalably-Verifiable Sequential Synthesis," *Int'l Conf. on Computer-Aided Design*, 7 pp. (Nov. 2008).

Park, "Concurrency and Automata on Infinite Sequences," *Theoretical Computer Science*, vol. 104, pp. 167-183 (1981).

Pixley, "A Theory and Implementation of Sequential Hardware Equivalence," *IEEE Trans. On Computer-Aided Design*, vol. 11, No. 12, pp. 1469-1478 (Dec. 1992).

Singhal et al., "Sequential Optimization in the Absence of Global Reset," *ACM Trans. On Design Automation of Electronic Systems*, vol. 8, No. 2, pp. 222-251 (Apr. 2003).

Van Eijk et al., "Exploiting Functional Dependencies in Finite State Machine Verification," *European Design and Test Conf.*, 6 pp. (Mar. 1996).

Van Eijk, "Sequential Equivalence Checking Based on Structural Similarities," *IEEE Trans. On Computer-Aided Design*, vol. 19, No. 7, pp. 814-819 (Jul. 2000).

\* cited by examiner

```
main() {
    A; // 1 C-step
    loop1 {// pipe, II-1
        B; // 3 C-steps
    }
    C; // 2 C-steps
    loop2 {// no pipe
        D; // 2 C-steps
    }
    E; // 1 C-step
}
```

FORMAL VERIFICATION USING MICROTRANSACTIONS

CROSS REFERENCE TO RELATED APPLICATIONS

This application claims the benefit of U.S. Provisional Application No. 62/007,852 entitled "FORMAL VERIFICATION USING MICROTRANSACTIONS" and filed on Jun. 4, 2014, and of U.S. Provisional Application No. 62/042,207 entitled "FORMAL VERIFICATION USING MICROTRANSACTIONS" and filed on Aug. 26, 2014, both of which are hereby incorporated herein by reference.

FIELD

This application relates to the formal verification of circuit descriptions as performed by specialized electronic design automation (EDA) tools and as may be performed during the design of an integrated circuit or other circuit.

SUMMARY

Disclosed below are representative embodiments of methods, apparatus, and systems for performing formal verification of circuit descriptions. In certain example embodiments, the disclosed technology involves the formal verification of a register-transfer-level ("RTL") circuit description produced from a high-level synthesis tool (e.g., a C, C++, or SystemC synthesis tool) relative to the original high-level code from which the RTL description was synthesized (e.g., the original C, C++, or SystemC description of a circuit design). The formal verification process of such embodiments comprises comparing the RTL description to the original high-level description to determine whether they are logically equivalent. In accordance with embodiments of the disclosed technology, the formal verification process, and in particular the equivalence checking process, is performed at a finer transactional level than previously possible. For instance, and as more fully disclosed below, embodiments of the disclosed technology verify the equivalence of microtransactions (sub-function-call-level transactions), thereby enabling, among other things, one or more of: scalable verification of practical designs generated through high-level synthesis, reduced verification time, reduced computational complexity and overhead during the verification process, or reduced memory usage during the verification process.

As more fully discussed below, embodiments of the disclosed technology can dramatically improve a transaction-based equivalence verification process, as can be used by an HLS formal verification tool. For instance, embodiments of the disclosed technology reduce the verification time and computational complexity associated with such transaction-based equivalence verification. Still further, by using embodiments of the disclosed microtransaction-based verification techniques, the computational overhead and memory used during formal verification is vastly reduced, thereby more efficiently using hardware resources during the formal verification process. Still further, some verification problems are simply too large to perform using conventional methods (e.g., designs with deep loops, such as those with 100 or more iterations). Embodiments of the disclosed technology enable the formal verification of such designs where verification would otherwise not be possible.

The foregoing and other objects, features, and advantages of the invention will become more apparent from the following detailed description, which proceeds with reference to the accompanying figures.

DETAILED DESCRIPTION

I. General Considerations

Figure 1:
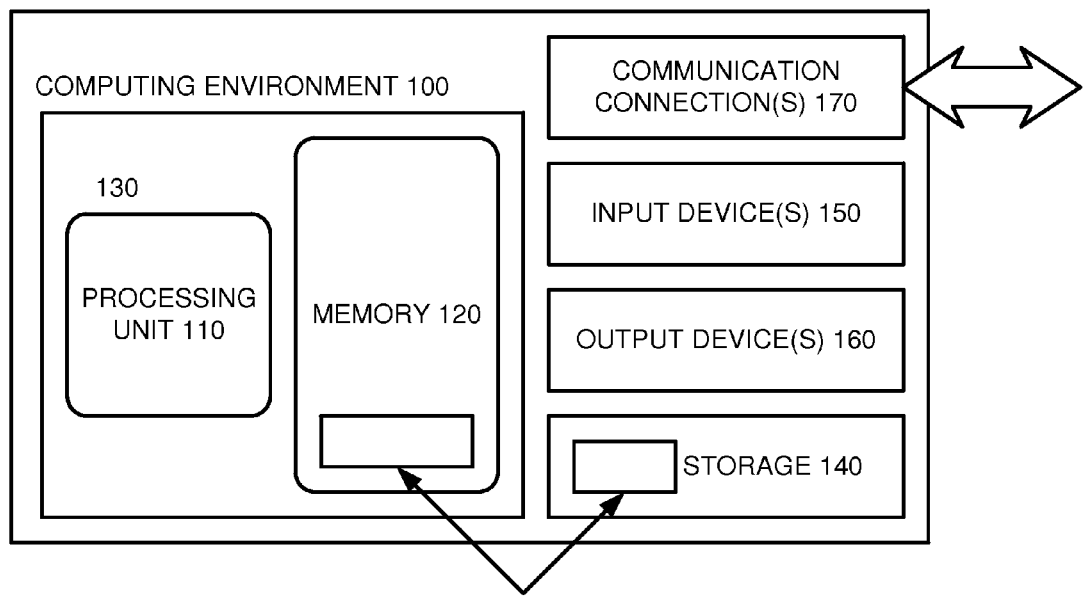
FIG. 1 illustrates a generalized example of a suitable computing environment in which several of the described embodiments can be implemented.

Disclosed below are representative embodiments of methods, apparatus, and systems for performing formal verification of circuit descriptions. In certain example embodiments, the disclosed technology involves the formal verification of a register-transfer-level ("RTL") circuit description produced from a high-level synthesis ("HLS") tool (e.g., an HLS tool for synthesizing C, C++, or SystemC descriptions of circuit designs) relative to the original high-level code from which the RTL description was synthesized (e.g., the original C, C++, or SystemC description).

The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine" and "flatten" to describe the disclosed methods. These terms are high-level abstractions of the actual operations that are performed. The actual operations that correspond to these terms may vary depending on the particular implementation and are readily discernible by one of ordinary skill in the art. Additionally, as used herein, the term "and/or" means any one item or combination of any items in the phrase.

II. Exemplary Computing Environments for Implementing Embodiments of the Disclosed Technology Any of the disclosed methods can be implemented as computer-executable instructions stored on one or more computer-readable media (e.g., tangible non-transitory computer-readable media, such as one or more optical media discs, volatile memory components (such as DRAM or SRAM), or nonvolatile memory or storage components (such as hard drives or solid state drives (e.g., solid state drives based on flash memory)) and executed on a computer (e.g., any suitable computer, including desktop computers, servers, smart phones, tablet computers, netbooks, or other devices that include computing hardware). Any of the computer-executable instructions for implementing the disclosed techniques as well as any data created and used during implementation of the disclosed embodiments can be stored on one or more computer-readable media (e.g., non-transitory computer-readable media). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), a distributed computing network, or other such network) using one or more network computers. Additionally, any intermediate or final result created or modified using any of the disclosed methods can be stored on a non-transitory storage medium (e.g., one or more optical media discs, volatile memory or storage components (such as DRAM or SRAM), or nonvolatile memory or storage components (such as hard drives or solid state drives)) and are considered to be within the scope of this disclosure.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in Python, C++, Java, Perl, JavaScript, or any other suitable programming language. Likewise, the disclosed technology is not limited to any particular computer or type of hardware. Certain details of suitable computers and hardware are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods can also be implemented by specialized computing hardware that is designed or configured to perform any of the disclosed methods. For example, the disclosed methods can be implemented (entirely or at least in part) by an integrated circuit (e.g., an application specific integrated circuit ("ASIC") or programmable logic device ("PLD"), such as a field programmable gate array ("FPGA")).

FIG. 1 illustrates a generalized example of a suitable computing environment 100 in which several of the described embodiments can be implemented. The computing environment 100 is not intended to suggest any limitation as to the scope of use or functionality of the disclosed technology, as the techniques and tools described herein can be implemented in diverse general-purpose or special-purpose environments that have computing hardware.

With reference to FIG. 1, the computing environment 100 includes at least one processing unit 110 and memory 120. In FIG. 1, this most basic configuration 130 is included within a dashed line. The processing unit 110 executes computer-executable instructions. In a multi-processing system, multiple processing units execute computer-executable instructions to increase processing power. The memory 120 may be volatile memory (e.g., registers, cache, RAM, DRAM, SRAM), non-volatile memory (e.g., ROM, EEPROM, flash memory), or some combination of the two. The memory 120 stores software 180 implementing one or more of the described HLS tools, verification tools, and/or techniques described herein. For example, the memory 120 can store software 180 for implementing any of the disclosed techniques described herein and their accompanying user interfaces.

The computing environment can have additional features. For example, the computing environment 100 includes storage 140, one or more input devices 150, one or more output devices 160, and one or more communication connections 170. An interconnection mechanism (not shown), such as a bus, controller, or network, interconnects the components of the computing environment 100. Typically, operating system software (not shown) provides an operating environment for other software executing in the computing environment 100, and coordinates activities of the components of the computing environment 100.

The storage 140 can be removable or non-removable, and includes one or more magnetic disks (e.g., hard drives), solid state drives (e.g., flash drives), magnetic tapes or cassettes, CD-ROMs, DVDs, or any other tangible non-transitory non-volatile storage medium which can be used to store information and which can be accessed within the computing environment 100. The storage 140 can also store instructions for the software 180 implementing any of the described techniques, systems, or environments.

The input device(s) 150 can be a touch input device such as a keyboard, touchscreen, mouse, pen, trackball, a voice input device, a scanning device, or another device that provides input to the computing environment 100. The output device(s) 160 can be a display device (e.g., a computer monitor, smartphone display, tablet display, netbook display, or touchscreen), printer, speaker, or another device that provides output from the computing environment 100.

The communication connection(s) 170 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods can be described in the general context of computer-readable instructions stored on one or more computer-readable media. Computer-readable media are any available media that can be accessed within or by a computing environment. By way of example, and not limitation, with the computing environment 100, computer-readable media include tangible non-transitory computer-readable media, such as memory 120 and/or storage 140, and do not include propagating carrier waves or signals per se.

The various methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 2:
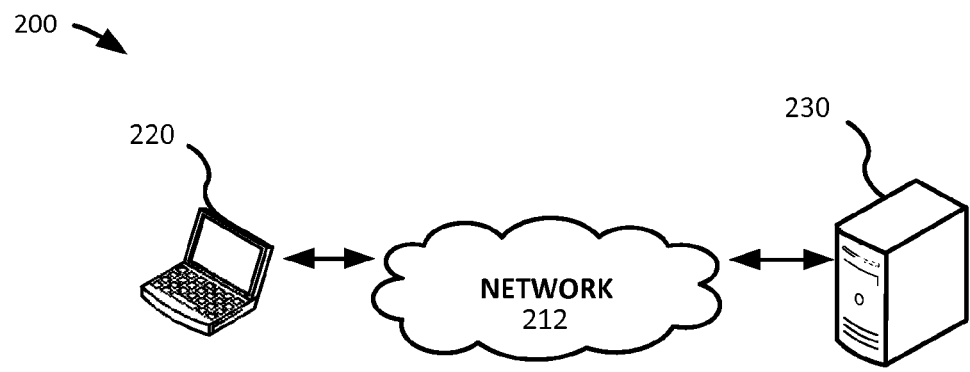
FIG. 2 illustrates an example of a possible network topology for implementing a system according to the disclosed technology.

An example of a possible network topology 200 (e.g., a client-server network) for implementing a system according to the disclosed technology is depicted in FIG. 2. Networked computing device 220 can be, for example, a computer running a browser or other software connected to a network 212. The computing device 220 can have a computer architecture as shown in FIG. 1 and discussed above. The computing device 220 is not limited to a traditional personal computer but can comprise other computing hardware configured to connect to and communicate with a network 212 (e.g., smart phones or other mobile computing devices, tablet computers, servers, network devices, dedicated devices, and the like). In the illustrated embodiment, the computing device 220 is configured to communicate with a computing device 230 (e.g., a remote server, such as a server in a cloud computing environment) via a network 212. In the illustrated embodiment, the computing device 220 is configured to transmit input data to the computing device 230, and the computing device 230 is configured to implement any of the disclosed methods and output results to the computing device 220. Any of the data received from the computing device 230 can be stored or displayed on the computing device 220 (e.g., displayed as data on a graphical user interface or web page at the computing devices 220). In the illustrated embodiment, the illustrated network 212 can be implemented as a Local Area Network ("LAN") using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 212 can be the Internet or a similar public network and operate using an appropriate protocol (e.g., the HTTP protocol).

Figure 3:
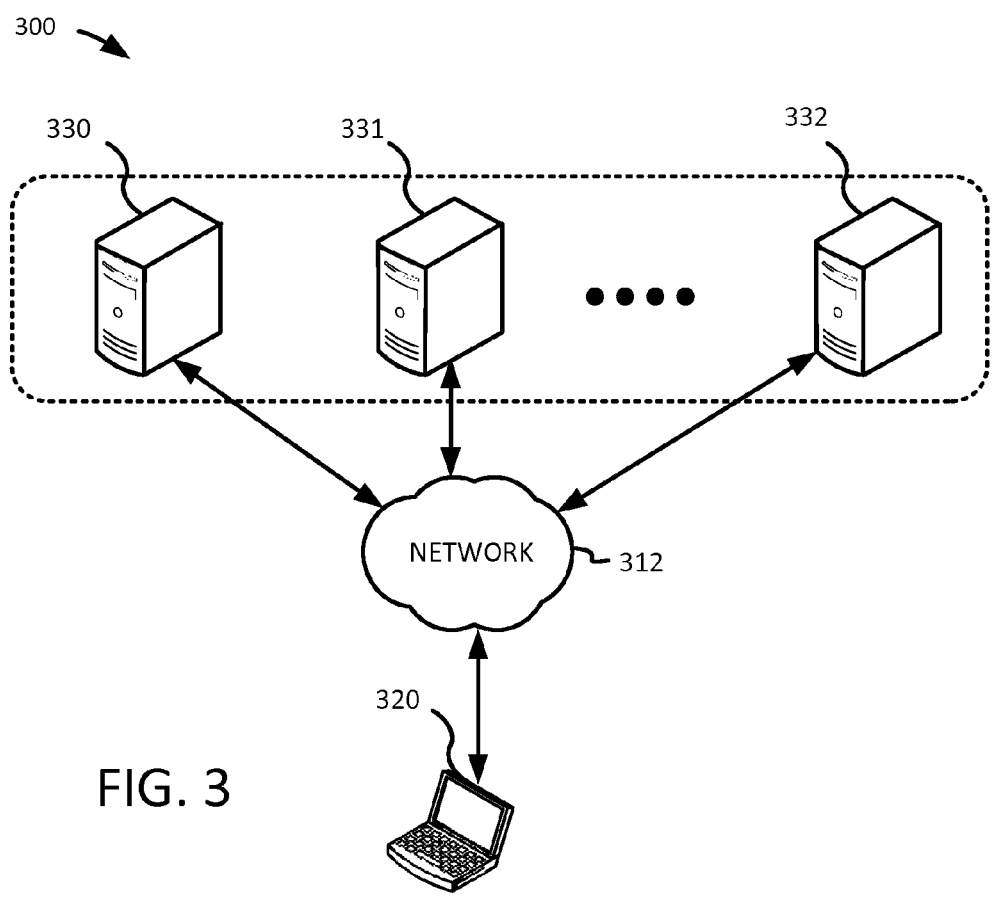
FIG. 3 illustrates another example of a possible network topology for implementing a system according to the disclosed technology.

Another example of a possible network topology 300 (e.g., a distributed computing environment) for implementing a system according to the disclosed technology is depicted in FIG. 3. Networked computing device 320 can be, for example, a computer running a browser or other software connected to a network 312. The computing device 320 can have a computer architecture as shown in FIG. 1 and discussed above. In the illustrated embodiment, the computing device 320 is configured to communicate with multiple computing devices 330, 331, 332 (e.g., remote servers or other distributed computing devices, such as one or more servers in a cloud computing environment) via the network 312. In the illustrated embodiment, each of the computing devices 330, 331, 332 in the computing environment 300 is used to perform at least a portion of the verification process. In other words, the computing devices 330, 331, 332 form a distributed computing environment in which the verification process is shared across multiple computing devices. The computing device 320 is configured to transmit input data to the computing devices 330, 331, 332, which are configured to distributively implement a verification process, including performance of any of the disclosed methods, and to provide results to the computing device 320. Any of the data received from the computing devices 330, 331, 332 can be stored or displayed on the computing device 320 (e.g., displayed as data on a graphical user interface or web page at the computing devices 320). The illustrated network 312 can be any of the networks discussed above with respect to FIG. 2.

III. Embodiments of the Disclosed Formal Verification Method

Described herein are methods, systems, and apparatus that can be used to perform formal verification. Embodiments of the disclosed technology can be used in a variety of applications in which formal verification is desired. For instance, the methods can be implemented as part of an electronic design automation ("EDA") software tool or suite of tools that performs high-level synthesis of a circuit design or supports or performs verification of a circuit design during the design process. For example, the disclosed methods can be implemented by a high-level synthesis formal verification tool ("HLS formal verification tool") used to verify a register-transfer level ("RTL") description after high-level synthesis of a C, C++, or SystemC description. Further, in some implementations, certain aspects of the disclosed technology can be implemented in part by the high-level synthesis tool ("HLS tool") that synthesized the high-level description into the RTL description. The RTL description that is verified and produced by the HLS tool can be any suitable RTL description (e.g., an RTL VHDL description, Verilog description, SystemVerilog description, or other such hardware description language ("HDL") description that describes a circuit design at the register-transfer level).

In particular embodiments, the disclosed technology comprises methods, systems, and apparatus for formally verifying an RTL description generated by a HLS tool. The formal verification process comprises comparing the RTL description to the original high level description to determine whether they are logically equivalent. In accordance with embodiments of the disclosed technology, the formal verification process, and in particular the equivalence checking process, is performed at a finer transactional level than previously possible. For instance, and as more fully disclosed below, embodiments of the disclosed technology verify the equivalence of microtransactions (sub-function-call-level transactions), thereby enabling, among other things, scalable verification of practical designs generated through high level synthesis, reduced verification time, reduced computational complexity and overhead, and/or reduced memory usage.

A wide variety of verification tools can be adapted to at least partially implement embodiments of the disclosed technology. In many of the examples disclosed herein, reference is made to the SLEC formal verification tool and Catapult high level synthesis tool, both available from Calypto Design Systems. These particular tools should not be construed as limiting, however, as the disclosed technology can be used or adapted for use in any suitable synthesis and/or formal verification tool, suite of tools, or system.

III.A. Introduction

Figure 4:
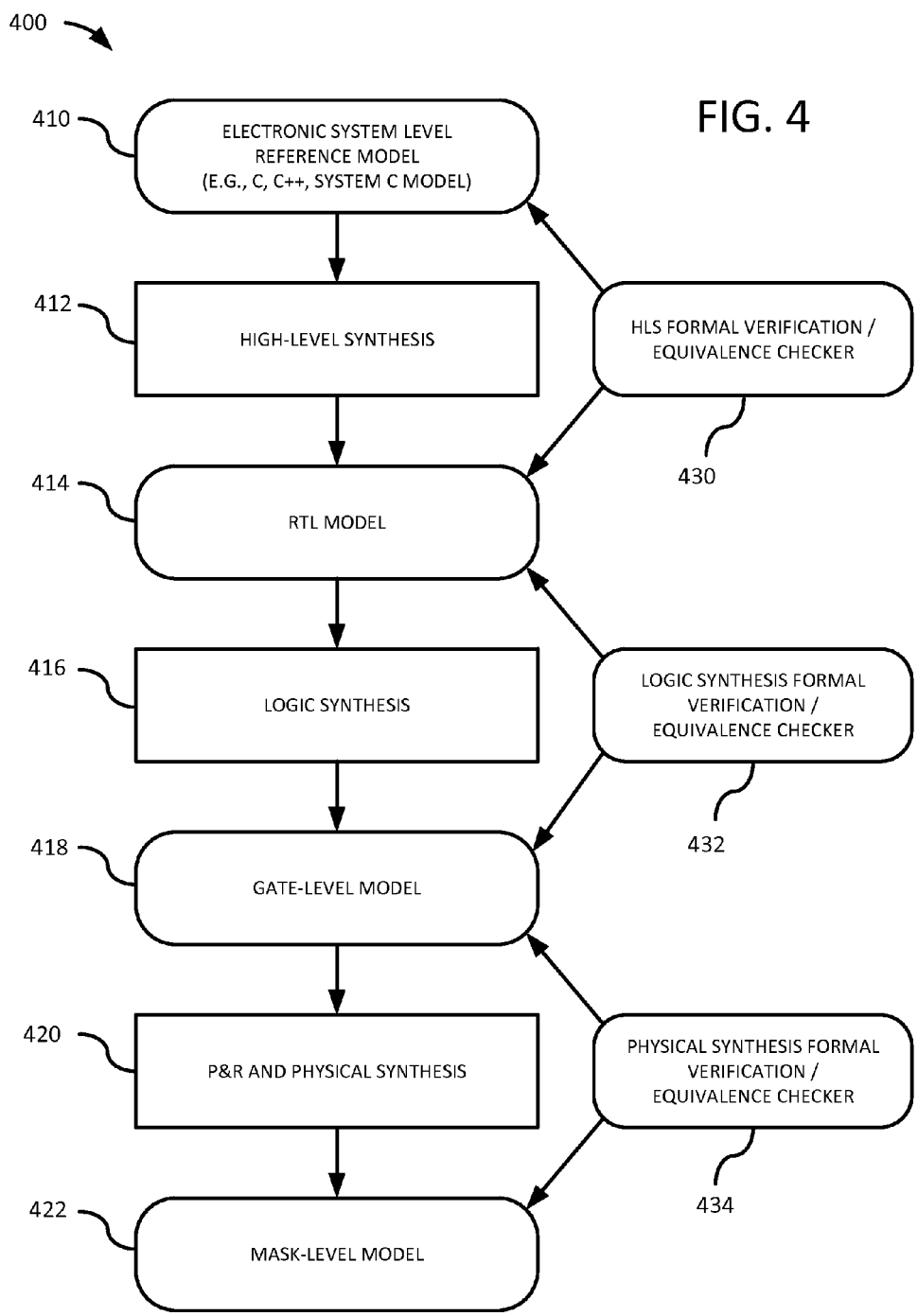
FIG. 4 is a schematic block diagram illustrating a design process for a circuit and illustrates where high-level synthesis (HLS) and HLS formal verification lie in the overall process.

As noted, the disclosed technology generally comprises methods, systems, and apparatus for formally verifying an RTL description generated by a high-level synthesis tool. The disclosed methods can be performed, for instance, by one or more EDA tools adapted to perform and/or support high-level synthesis and/or formal verification. FIG. 4 is a schematic block diagram 400 illustrating a design process for a circuit (e.g., an integrated circuit, system-on-a-chip, or other such circuit) and illustrates where high-level synthesis and high-level synthesis formal verification lie in the overall process.

In the illustrated design flow, the process begins with an electronic system level reference model 410. This electronic system level reference model is typically a high-level (algorithmic) description of the circuit. For instance, the model can be a C, C++, SystemC, or other such model of the circuit written at a level of abstraction higher than the register-transfer-level ("RTL"). Such high-level models can include other algorithmic descriptions that are higher level or different than RTL descriptions. At 412, high-level synthesis ("HLS") is performed to convert the high-level description of 410 into a lower-level description, here an RTL-level model 414 (e.g., an RTL VHDL description, Verilog description, SystemVerilog description, or other such HDL description that describes a circuit design at the register-transfer level). Any suitable HLS tool can be used to perform the HLS 412. For instance, the Catapult HLS tool available from Calypto Design Systems can be used.

In the illustrated design flow, an HLS formal verification tool 430 is used to compare the electronic system level reference model (high-level description) to the RTL description 414 resulting from HLS 412 and to formally verify that the two are logically equivalent. This formal verification process is typically performed at least in part by an equivalence checker (e.g., an HLS equivalence checker) configured to compare the high-level description to the RTL description. Any suitable equivalence checker for HLS can be used, such as the SLEC tool available from Calypto Design Systems.

Embodiments of the disclosed technology can be used to improve the verification process performed by the HLS formal verification tool 430. As more fully discussed below, embodiments of the disclosed technology can dramatically improve a transaction-based equivalence verification process, as can be used by the HLS formal verification tool 430. For instance, embodiments of the disclosed technology reduce the verification time and the computational complexity associated with such transaction-based equivalence verification. Still further, by using embodiments of the disclosed microtransaction-based verification techniques, the computational overhead and memory used during formal verification is vastly reduced, thereby more efficiently using computing resources during the formal verification process. Still further, some verification problems are simply too large to perform using conventional methods. Thus, embodiments of the disclosed technology enable formal verification for certain designs (e.g., designs with deep loops (such as those with embedded loops of 100+ iterations)).

Exemplary tools and techniques for performing transaction-based formal verification and with which any embodiment of the disclosed technology can be used (as described in the sections below) are discussed in more detail in, for instance, U.S. Pat. No. 7,350,168, entitled "SYSTEM, METHOD AND COMPUTER PROGRAM PRODUCT FOR EQUIVALENCE CHECKING BETWEEN DESIGNS WITH SEQUENTIAL DIFFERENCES", issued on Mar. 25, 2008, and filed on May 12, 2005; U.S. Pat. No. 7,607,115, entitled "SYSTEM, METHOD AND COMPUTER PROGRAM PRODUCT FOR TIMING-INDEPENDENT SEQUENTIAL EQUIVALENCE VERIFICATION", issued on Oct. 20, 2009, and filed on Oct. 4, 2006; and P. Chauhan et al., "Non-cycle-accurate Sequential Equivalence Checking," *Proceedings of the 46th Annual Design Automation Conference*, pp. 460-465 (2009), all of which are incorporated herein by reference.

Returning to the design flow of FIG. 4, at 416, logic synthesis is performed to convert the RTL description 414 into a gate-level model 418 (e.g., an EDIF netlist or the like). Any suitable logic synthesis tool can be used to perform the logic synthesis 416. At 432, another formal verification process is performed to verify the logical equivalence of the descriptions. In particular, at 432, a logic synthesis formal verification tool is used to compare the RTL description 414 to the gate-level netlist 418 and to formally verify that the two are logically equivalent. Any suitable logic synthesis formal verification tool, typically comprising an equivalence checker adapted to compare RTL descriptions to gate-level netlists can be used.

At 420, place and route as well as physical synthesis is performed to convert the gate-level model 418 into a mask-level model 422 (e.g., a GDSII model or the like). The physical synthesis process can involve numerous other processes as well, such as floorplanning, partitioning, clock-tree synthesis, and other such processes that may accompany physical synthesis. At 434, a further formal verification process is performed to verify the logical equivalence of the descriptions. In particular, at 434, a physical verification tool is used to compare the gate-level netlist 418 to the mask-level model 420 and to formally verify that the two are logically equivalent. Any suitable physical synthesis formal verification tool, typically comprising an equivalence checker adapted to compare gate-level netlists to mask-level models can be used.

From the mask-level model, masks can be printed and used to fabricate the physical circuit (e.g., an ASIC, FPGA, SOC, or other such integrated circuit or circuit) using a variety of known integrated circuit fabrication techniques.

Figure 5:
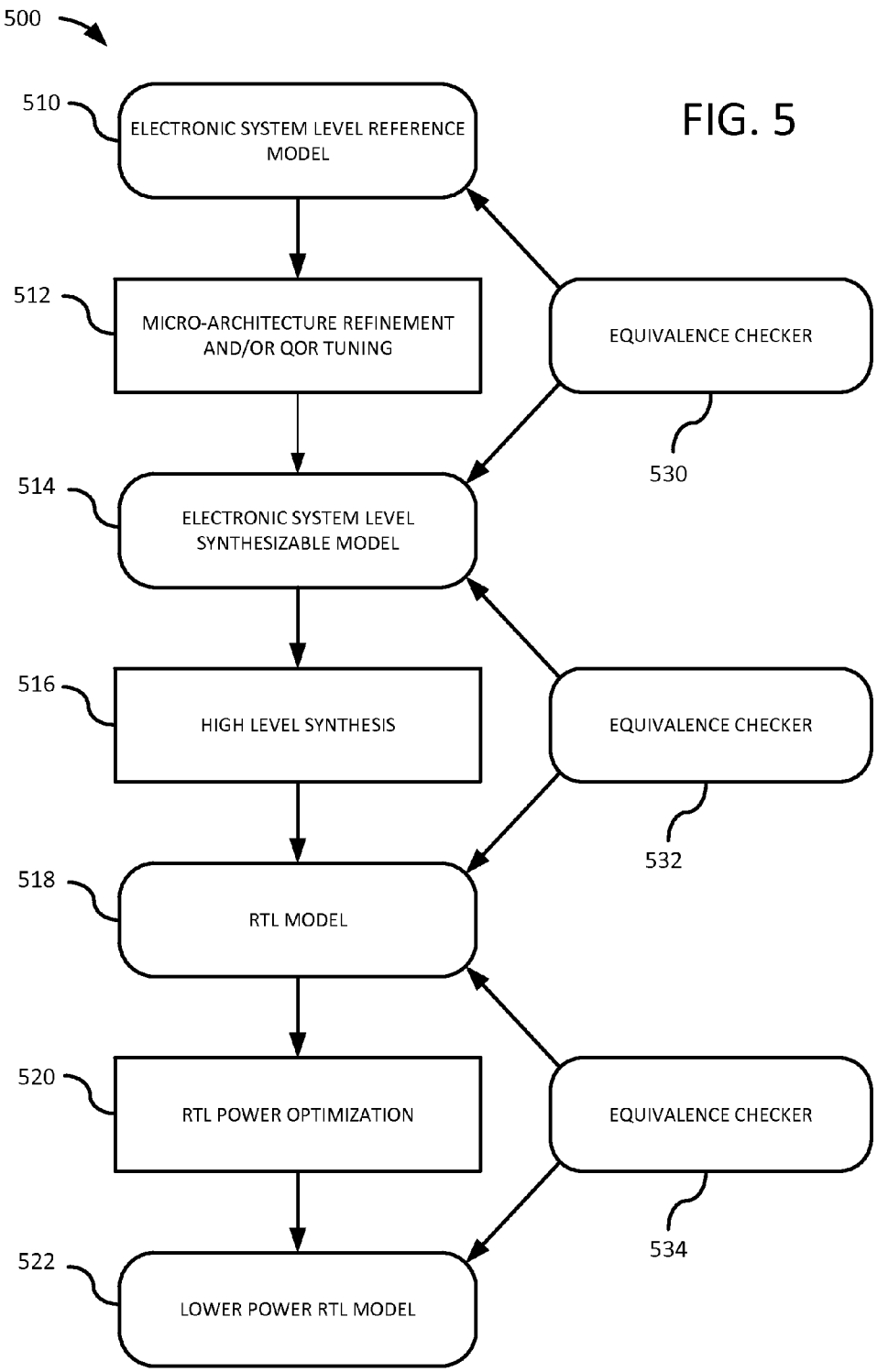
FIG. 5 is a schematic block diagram illustrating certain additional processing and verification stages that may exist as a circuit design is being converted into RTL from a high-level description.

While FIG. 4 shows a typical circuit design and manufacturing process at a high level, additional processing and verification steps may exist at any of the illustrated stages. For instance, FIG. 5 is a schematic block diagram 500 illustrating certain additional processing and verification stages that may exist as a circuit design is being converted into RTL from a high-level description (e.g., a C, C++, or SystemC description).

In the illustrated design flow, the process begins with an electronic system level reference model 510 (e.g., a high-level description of the circuit written in C, C++, SystemC, or other such model of the circuit written at a level of abstraction higher than the register-transfer-level (RTL)). At 512, processing of the high-level description is performed to optimize the description for HLS synthesis. In the illustrated embodiment, this processing includes, for example, microarchitecture refinement and/or quality-of-results (QoR) tuning. The processing at 512 results in an electronic system level synthesizable model 514.

In the illustrated design flow, an equivalence checker 530 adapted for comparing the electronic system level reference model 510 to the electronic system level synthesizable model 514 is used to compare and verify the equivalence of the two descriptions. The equivalence checker 530 can be implemented as part of a formal verification tool.

The process continues at 516, where high-level synthesis is performed to convert the electronic system level synthesizable model (e.g., a high-level description with optimizations) 514 into an RTL description 518. In the illustrated design flow, an equivalence checker 532 adapted for comparing the electronic system level synthesizable model (e.g., a high-level description with optimizations) to the RTL description is used to verify the equivalence of the two descriptions. The equivalence checker 532 can be implemented as part of an HLS formal verification tool.

As noted, embodiments of the disclosed technology can be used to improve the verification process performed by the equivalence checker 532. For instance, embodiments of the disclosed technology reduce the verification time, the computational complexity, the computational overhead, and/or the memory usage associated with the HLS formal verification process.

The process continues at 520, where RTL power optimization is performed to modify the RTL model 518 in order to improve its power characteristics (e.g., to reduce power consumption in the circuit described by the RTL description). RTL power optimization 520 produces a lower power RTL model 522. In the illustrated design flow, an equivalence checker 534 adapted for comparing the RTL model to the lower power RTL model is used to verify the equivalence of the two descriptions. The equivalence checker 534 can be implemented as part of a formal verification tool.

Figure 6:
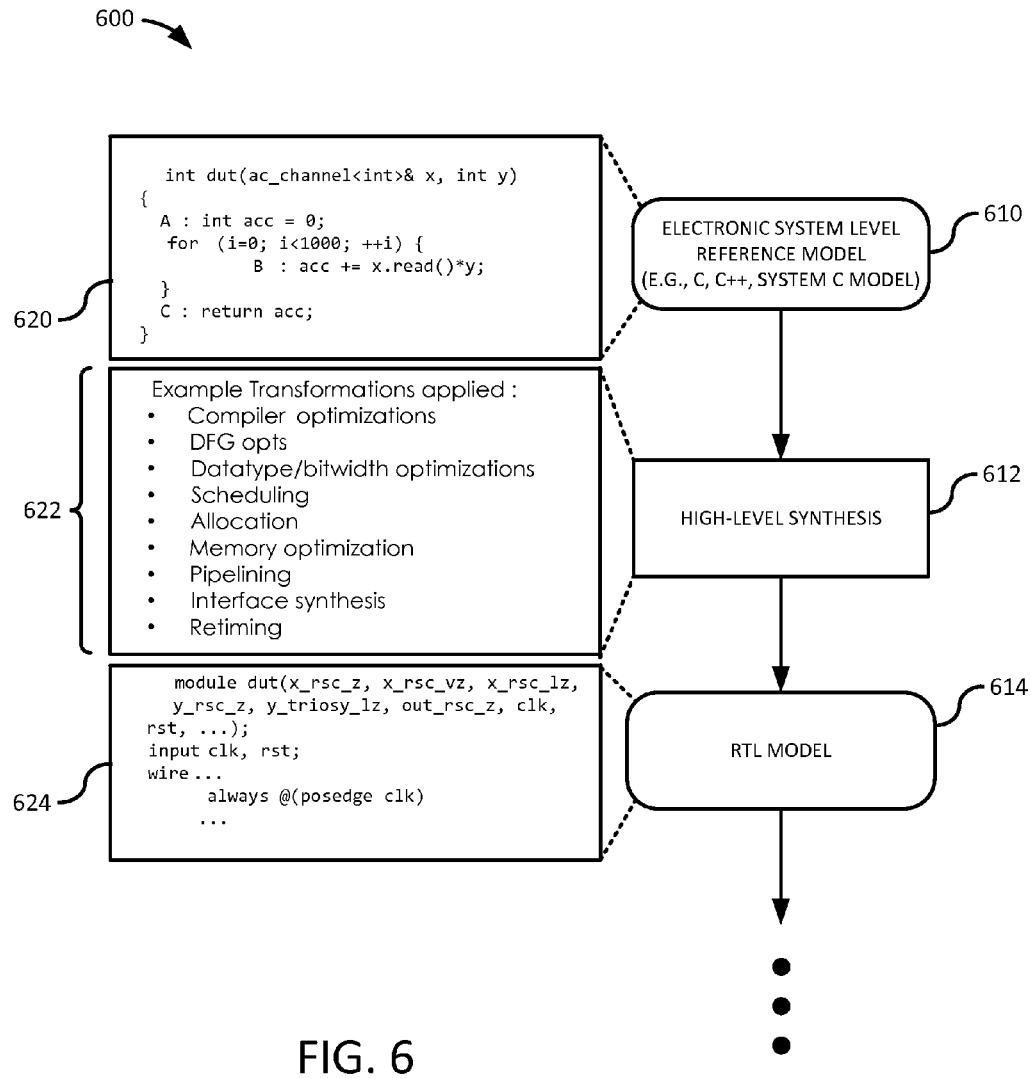
FIG. 6 is a schematic block diagram that illustrates in more detail one or more of the transformations that can be performed during high level synthesis and after which logical equivalence of the designs should be maintained.

FIG. 6 is a schematic block diagram 600 that illustrates in more detail one or more of the transformations that can be performed during high-level synthesis and after which logical equivalence of the designs should be maintained. FIG. 6 helps illustrate the high-level synthesis process generally, as well as the need for HLS formal verification in order to verify that none of the transformations altered the logical operations or other behavior of the desired circuit. In particular, FIG. 6 shows a design flow in which an electronic system level reference model 610 is converted into an RTL model 614 by a high-level synthesis process 612. FIG. 6 also shows a generalized example 620 of the electronic system level reference model 610 (here, a generalized C++ example), and a generalized example 624 of the resulting RTL. Also shown in FIG. 6 are example transformations 622, any one or more of which may be performed during high-level synthesis.

The transformations that are performed during high-level synthesis have the potential to alter the circuit design described by the RTL in a manner that changes the logical function of the design. Consequently, the RTL may no longer describe the logical equivalent of the original design, and may therefore result in an unsatisfactory or inoperative circuit should the circuit design process continue. HLS formal verification, and logic equivalence checker adapted for use at this stage, are therefore useful in detecting discrepancies in the RTL design that cause it to no longer be the logical equivalent of the high-level description (e.g., the C, C++, SystemC description) input into the high-level synthesis tool.

III.B. Verifying Using Sub-Function-Call Transactions (Microtransactions)

Figure 7:
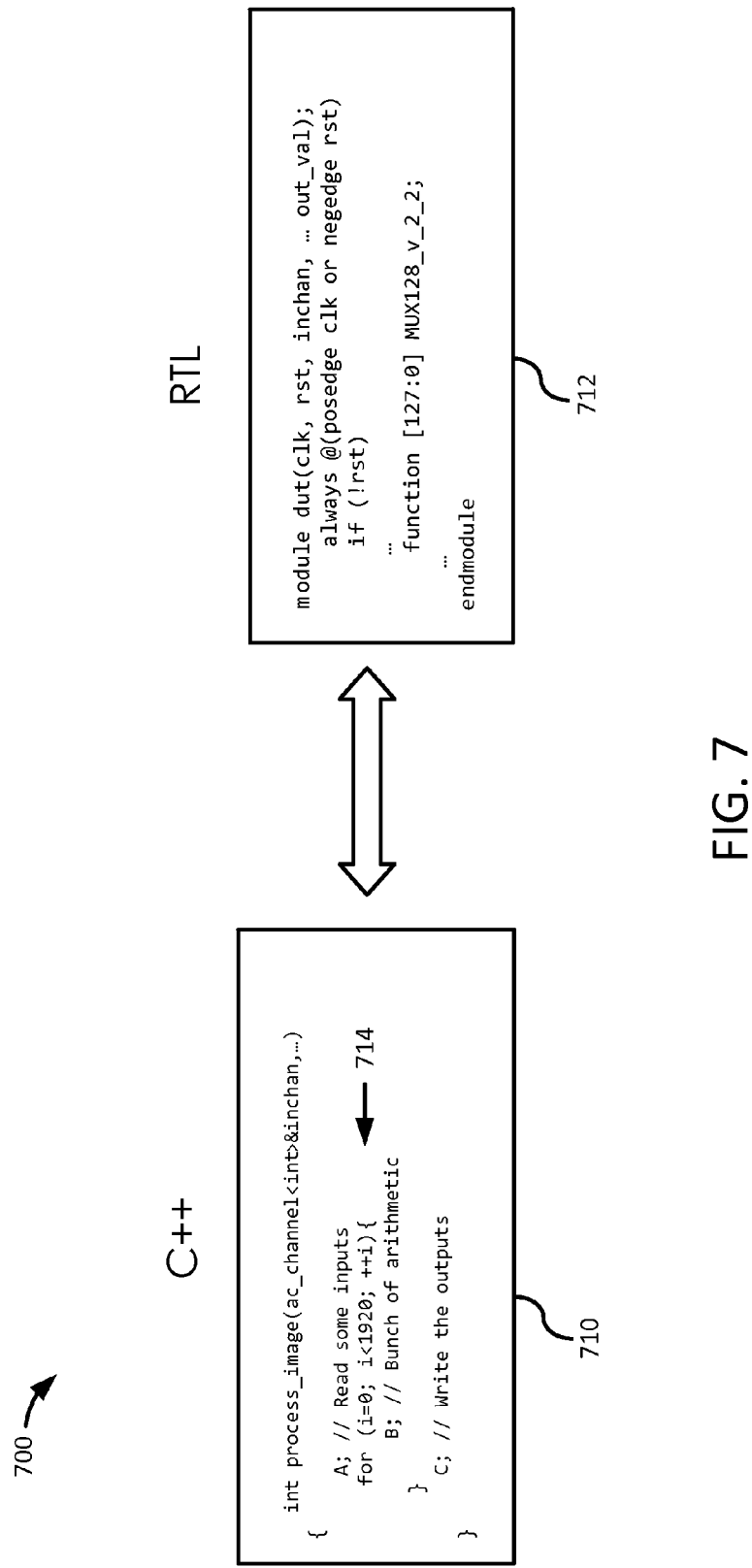
FIG. 7 is a block diagram schematically illustrating a method for performing formal verification.

FIG. 7 is a block diagram 700 schematically illustrating a method for performing formal verification. In particular, block diagram 700 illustrates a formal verification technique in which all the code in a function call of a high-level description 710 is compared to and verified against all the corresponding RTL code in the RTL description 712 as part of a single verification transaction. It should be noted that the example code portions in 710, 712 are not shown in their entirety, but the example code portions 710, 712 are illustrative of functions and code components commonly encountered during formal verification.

The verification process in block diagram 700 treats the entire function call in high-level design as a single transaction to be verified. In particular, formal verification is performed across all possible inputs into the function in the high-level description and the RTL description, and the outputs resulting from all operations performed within the function (the outputs at the end of the transaction) are compared at the end of the function. As illustrated, in this example, the function call of the high-level description includes a loop 714 with 1920 iterations. Thus, the transaction to be verified includes more than a thousand operations. When accounting for all possible inputs, this verification process can consume millions of cycles. Such deep loops are extremely burdensome, time-consuming, and computationally and memory intensive for a formal verification tool (e.g., a logical equivalence checker). In many, if not all, instances, the formal verification tool simply cannot handle the long transactions that are produced by loops in the high-level design. For instance, capacity issues can be experienced by the formal verification tool, or design elaboration may not be possible. Still further, the time it takes to perform the verification of such deep loops may be extremely long (e.g., more than 10 hours), making the typical HLS formal verification process unacceptably slow, especially when minor design iterations are introduced or when time-critical designs are being developed.

Embodiments of the disclosed technology address these problems by, for example, fundamentally altering the size of the transaction considered by an HLS formal verification tool that performs transaction-based verification. Embodiments of the disclosed technology greatly relieve the computational and/or memory burden of the HLS formal verification tool and vastly reduce the time it takes to perform HLS formal verification (e.g., logic equivalence checking). In particular, embodiments of the disclosed technology alter the size of the formal verification transaction to transactions smaller than the function-call level. Such sub-function-call-level transactions are referred to herein as "microtransactions" and allow formal verification to proceed in a far more scalable fashion than previously possible.

Figure 8:
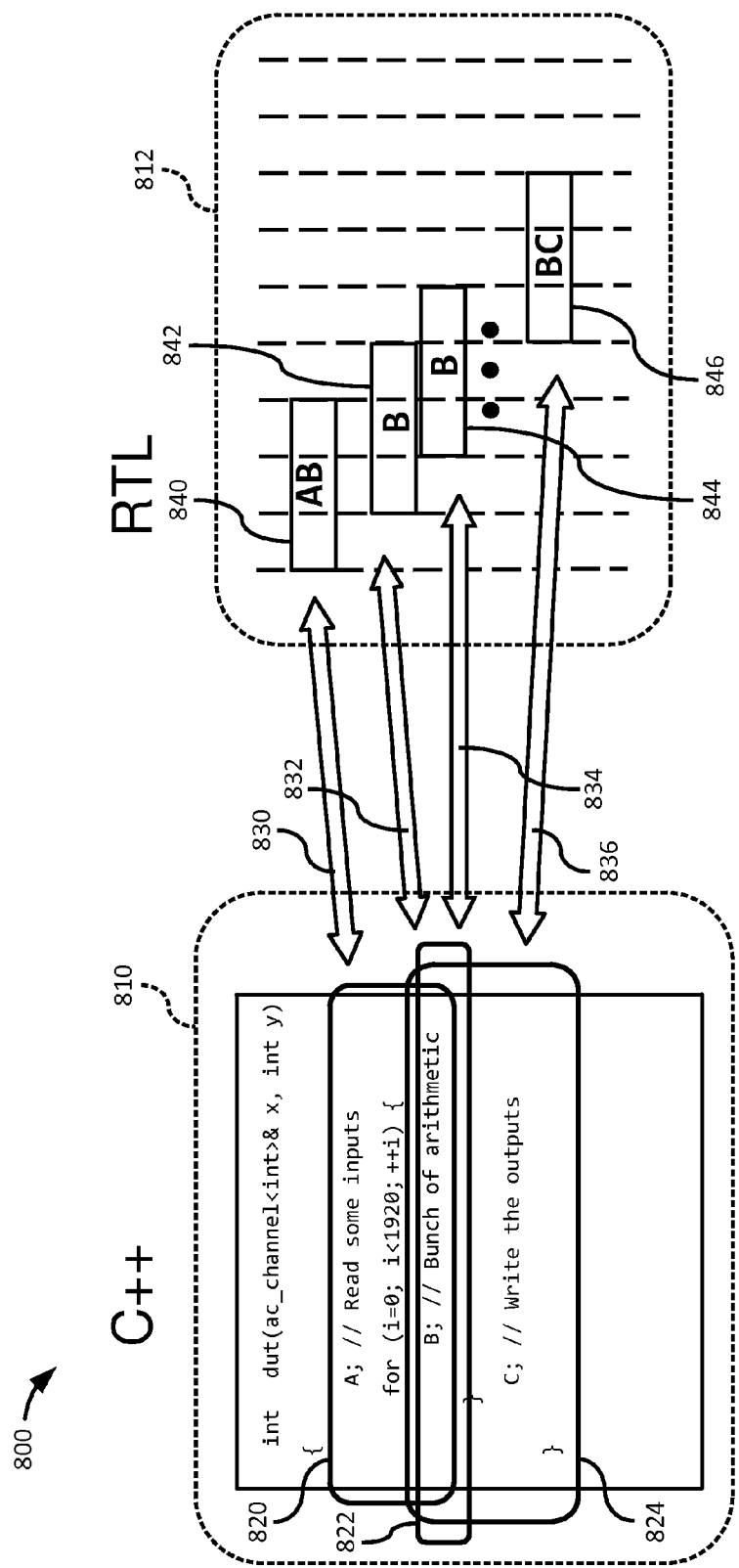
FIG. 8 is a block diagram schematically illustrating an exemplary method for performing formal verification according to embodiments of the disclosed technology.

FIG. 8 is a block diagram 800 schematically illustrating an exemplary method for performing formal verification according to embodiments of the disclosed technology. In FIG. 8, arrows 830, 832, 834, 836 illustrate separate verification processes performed on transactions 820, 822, 824 defined by the high-level design 810 and corresponding transactions 840, 842, 844, 846 defined in the RTL description 812. As seen in FIG. 8, each loop iteration (corresponding to multiple iterations of transaction 822) comprises a separate transaction (e.g., transactions 842, 844) that is formally verified by a formal verification tool (e.g., a logic equivalent checker).

By presenting the formal verification tool with transactions of a size smaller than a function call, the problem size to be considered by the tool is vastly reduced. Nonetheless, the accuracy and reliability of the verification result is still maintained. For example, if one keeps the abstract picture of a finite state machine in mind, with a combinational part and state elements (registers/flops, etc.), then the full-function-based transaction would have a few state elements but a hugely bloated combinational part. With microtransaction-based verification, there will typically be more state elements, but the combinational portion will be reduced to a great degree. In other words, microtransaction-based verification provides an efficient balance in the time-space tradeoff that can affect verification rather than the extreme spatial burden experienced by full-function-based verification. In particular embodiments, one effect of such microtransaction-based formal verification is that the final size of the circuit (combinational logic+state elements) that is used as input to the verification tool is much smaller than the full-function approach. Further, microtransaction-based verification allows finer grain induction for verification.

Figure 9:
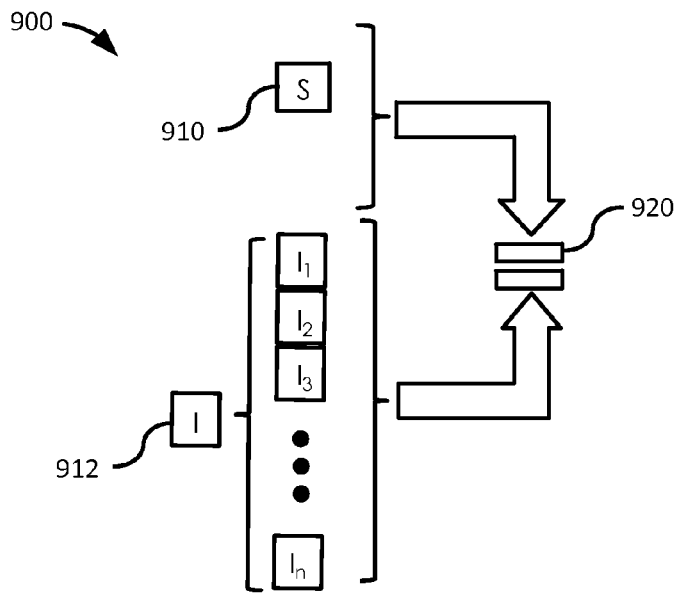
FIGS. 9-12 are block diagrams providing additional schematic illustrations of example differences between a functional-call-level verification approach and a sub-function-call-level (microtransaction) verification approach according to embodiments of the disclosed technology.
Figure 10:
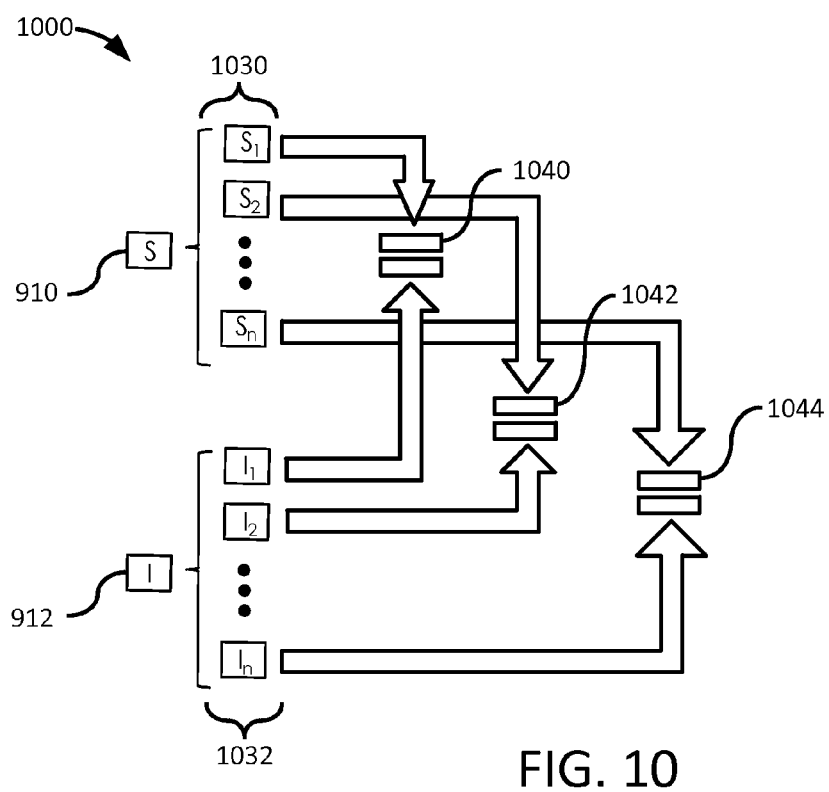

FIGS. 9-10 are block diagrams 900 and 1000 providing additional schematic illustrations of example differences between a functional-call-level verification approach and a sub-function-call-level (microtransaction) verification approach according to embodiments of the disclosed technology. In particular, in both diagrams 900 and 1000, the verification problem is shown as one of formally verifying that a function call 910 of a high-level circuit design description (e.g., a C, C++, SystemC description) is equivalent to a circuit design description at a lower level of abstraction (e.g., an RTL description) 912. In block diagram 900, the transaction to be verified is the entire function call 910, as shown by the arrows leading to a single compare operation 920.

By contrast, block diagram 1000 illustrates verification of multiple transactions 1030 within the function call 910 to multiple corresponding portions 1032 of the lower-level description 912 (e.g., an RTL level). Because the transactions 1030, 1032 are sub-function-call-level transactions, they are often referred to as "microtransactions" herein. This sub-functional-call-level verification is illustrated by the arrows leading to the multiple compare operations 1040, 1042, 1044 in FIG. 10.

Figure 11:
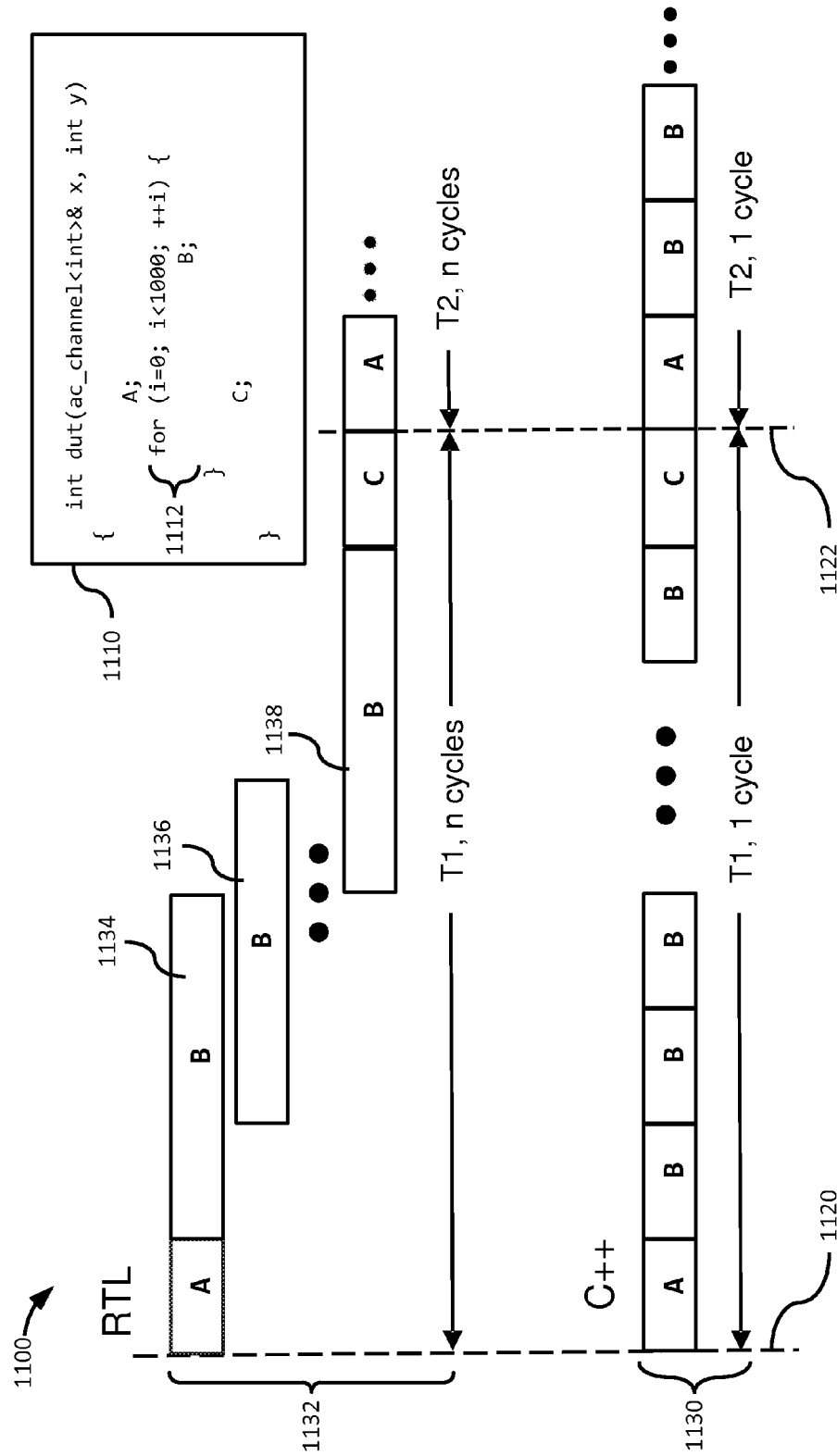
Figure 12:
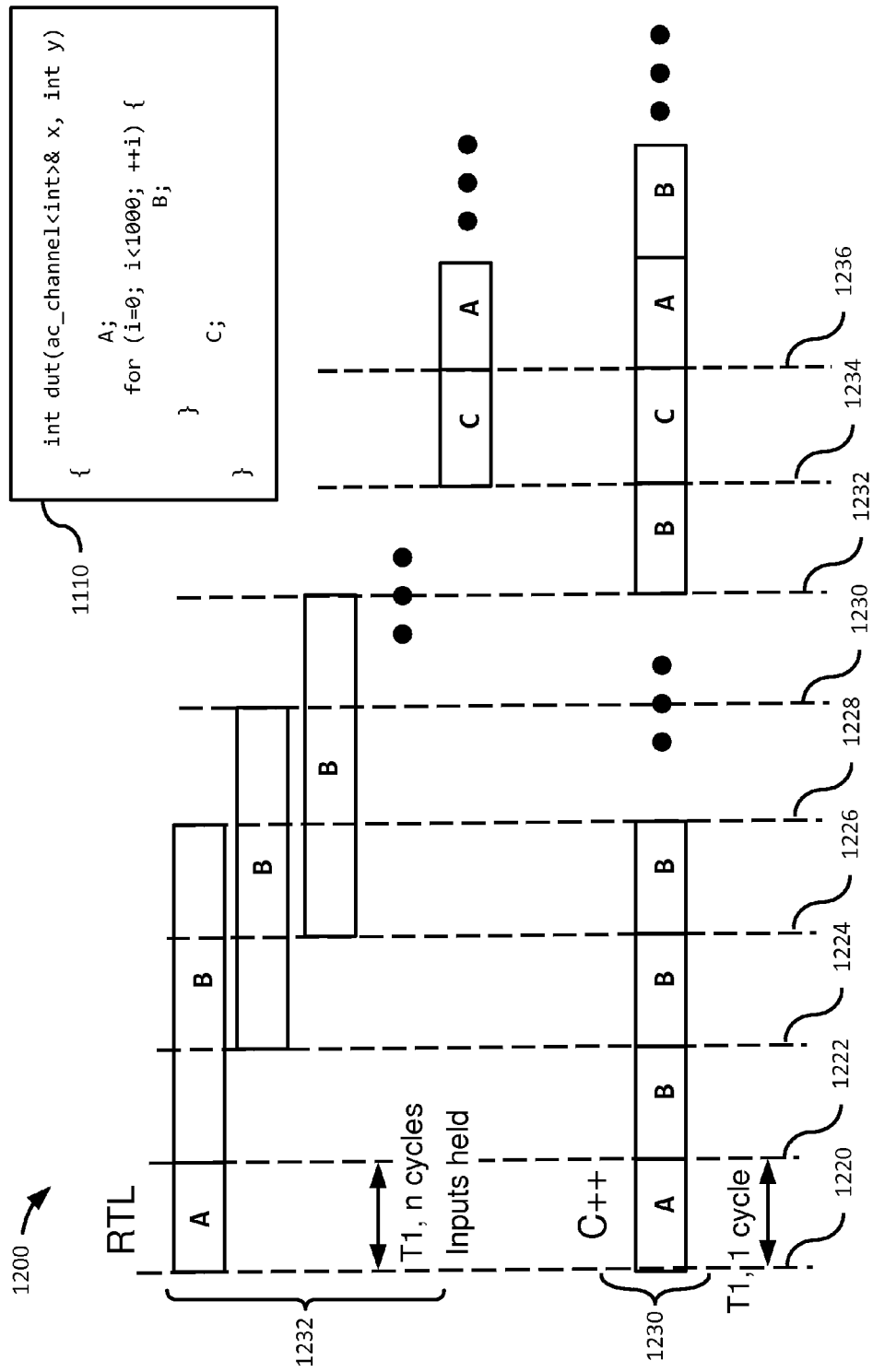

FIGS. 11-12 are block diagrams 1100 and 1200 providing another schematic illustration of example differences between a functional-call-level verification approach and a sub-function-call-level (microtransaction) verification approach according to embodiments of the disclosed technology. FIG. 11 shows a generalized example 1110 of a function call from a high-level description in which the function call includes a loop 1112 in which code portion "B" iterates for 1000 cycles. FIG. 11 also illustrates a first transaction boundary 1120 followed by a second transaction boundary 1122, which together define the transaction on which a formal verification tool (e.g., a logical equivalence checker) operates. In FIG. 11, the two illustrated transaction boundaries 1120, 1122 show that the transaction considered by the formal verification tool encompasses all operations within the function call illustrated in 1110 (code portion "A", code portion "B" (which iterates 1000 times according to the defined loop), and code portion "C"). (In general, the term "code portion" as used herein refers to one or more sequential lines of code.) This transaction is shown as being executed in one clock cycle of the high-level description 1130, and potentially multiple (n) RTL clock cycles during execution of the RTL description 1132, in which the iterations of code portion "B" are performed in a pipelined manner (illustrated by pipelined iterations 1134, 1136, 1138). This difference in clock cycles is the result of the translation of the high-level description into an RTL description, which represents sequential operations as are to be performed by a circuit but also represents certain operations as being performed in a pipelined fashion (such as iterations of looped code portion "B") over multiple clock cycles. Another potential source for a difference in clock cycles is due to the scheduling of operators that may occur during HLS synthesis. For instance, the HLS tool may schedule an operator (e.g., a multiplier or other such operator) over several RTL clock cycles so as to maintain proper timing for downstream synthesis tools (e.g., for a logic synthesis tool that transforms the RTL into a gate-level netlist). FIG. 11 also shows that the particular example function in 1110 is itself an iteration of a top-level loop, resulting in the function being repeated during the next clock cycle for the high-level description.

FIG. 12 is a block diagram 1200 in which verification is performed on transactions at a level of granularity smaller than the function-call level. In particular, the block diagram 1200 shows how the example 1110 of FIG. 11 can be partitioned (or divided) into multiple microtransactions (transactions at a sub-function-call level), thereby allowing formal verification to proceed with transactions that reduce the overall formal verification time, make the formal verification process less computationally intensive, and reduce the amount of memory and other computational resources used during the formal verification process. In particular, FIG. 12 shows how the example 1110 can be divided into multiple transactions for the processes within the high-level description, including transactions for each iteration of a loop defined in the high-level description. In this regard, FIG. 12 shows transaction boundaries 1220, 1222, 1224, 1226, 1228, 1230, 1232, 1234, 1236, created to define multiple smaller transactions within the function call of the high-level description and RTL description for verification purposes. In the illustrated embodiment, these transaction boundaries include boundaries for creating individual transactions for each iteration of the loop defined in the high-level description. As illustrated in FIG. 12, the high-level description 1110 is modified to create transaction 1230, where each sub-function-call-level transaction (microtransaction) is executed in one clock cycle during verification. As will be more fully explained below, corresponding transactions 1232 in the RTL description may comprise one or multiple (n) RTL clock cycles. In particular embodiments, execution of the RTL description is selective stalled so that the transactions 1232 of the RTL description are aligned with the transactions 1230 of the high-level description during verification.

In order to implement one or more of the embodiments of the disclosed technology, modifications to one or both of the high-level description and the RTL description are performed (or implemented during performance of the verification process) so that formal verification is performed accurately and according to the capabilities of the formal verification tool. The overall process of identifying microtransactions and creating the proper transaction boundaries for the microtransactions is referred to as loop induction. During loop induction, various modifications may be made to the high-level description and/or the RTL description in order to allow the formal verification tool to verify the descriptions on a microtransaction level. The subsections below discuss embodiments of some of the modifications that can be made in order to enable a verification process according to the disclosed technology. The example modifications presented include: loop flattening and wait insertion, selective RTL stalling, delay insertion to compensate for pipeline drain, and probe insertion. More specifically, the subsections below discuss example loop flattening processes that can be used to create the transaction boundaries according to the disclosed technology, selective stalling of the RTL during the formal verification process in order to align the transaction boundaries of the RTL description with the transaction boundaries of the high-level description (e.g., so that the RTL description has a common throughput during verification or so that both descriptions have a common throughput during verification), delay insertion processes that can be used to insert one or more statements creating delay (e.g., wait states) into the high-level description to compensate for pipeline drain so that a pipelined loop in the RTL description will align with the high-level description during verification, and probe insertion techniques that results in one or more probes being inserted into the RTL description (or both the high-level description and the RTL description) that probe and store state data and control data used by the formal verification tool during microtransaction-based verification.

Any one or more of these techniques can be used alone or in combination with one another (depending on the situation) in order to implement a formal verification process using microtransactions.

III.B.1. Loop Flattening and Wait Insertion

III.B.1.a. In General

This section describes loop flattening and wait insertion techniques that can be used to insert statements into the high-level description that create transactional boundaries between iterations of a loop defined in the high-level description. In particular embodiments, the statements that create the transactional boundaries are wait statements, which can be used by the formal verification tool to create a boundary to a verification transaction. For instance, the wait statement can provide a control point where outputs and/or intermediate values from the loop iteration can be evaluated against corresponding RTL statements. The use of wait statements should not be considered limiting, however, as the transaction boundaries can be created through or in conjunction with other mechanisms as well. For instance, control logic can be inserted into the high-level description to control the advancement of the high-level description through the individual code portions in a function call. For instance, and as more fully explained below, control probes can be inserted into the high-level and RTL design at the beginning, during, and at the end of loops to facilitate verification by producing information that helps align the high-level design to the RTL design. Further, data probes can be inserted into the RTL design and used to generate and output state values in the RTL design that correspond to variables at a particular state in the high-level design. Such data probes can be used at the transaction boundaries to generate the inductive invariants at the transaction boundaries and associated maps for state-holding variables that are used to verify the equivalency of the designs.

Figure 13:
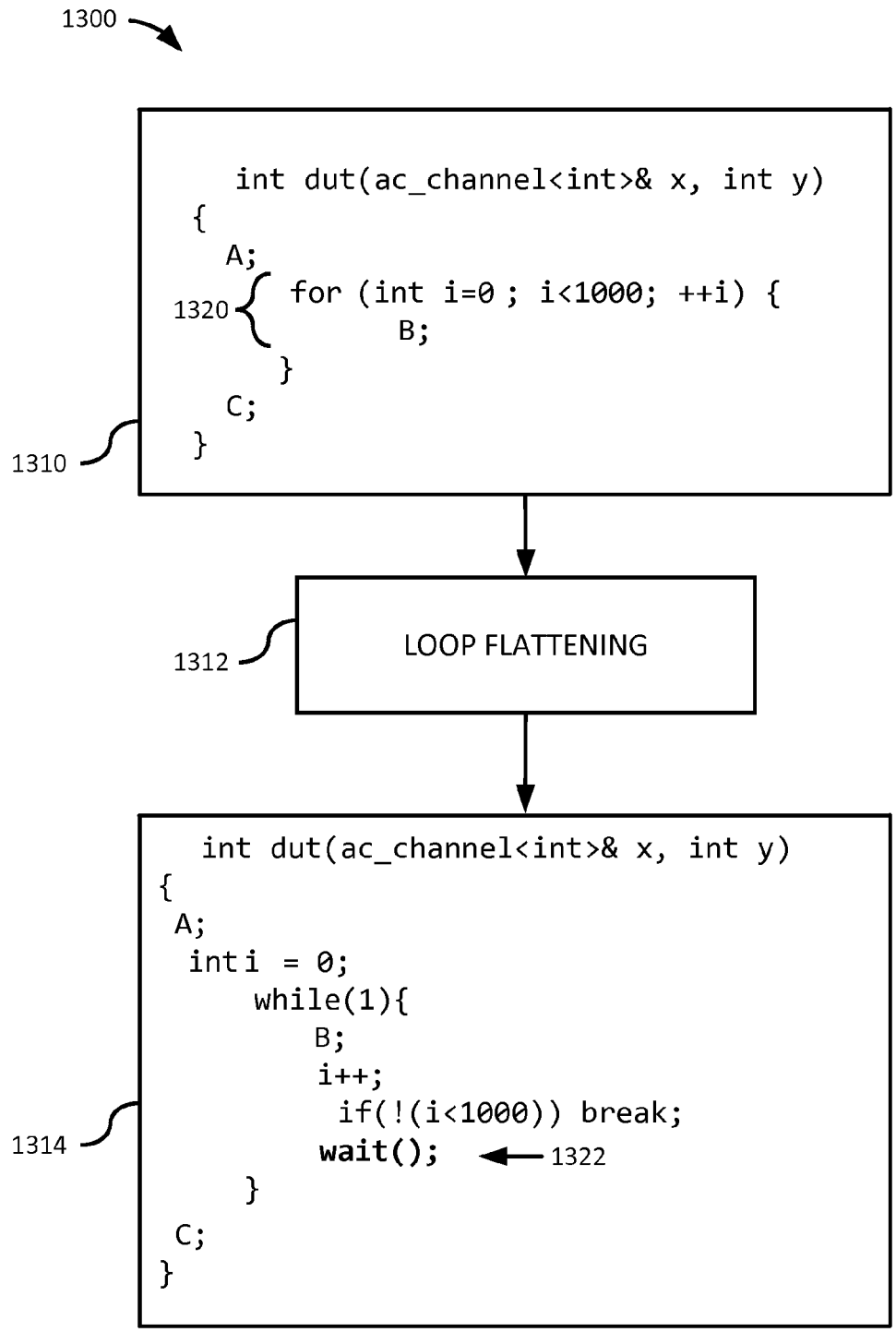
FIG. 13 is a schematic block diagram illustrating an example of inserting a wait statement into a high-level circuit description in order to create sub-function-call-level transactions.

FIG. 13 is a schematic block diagram 1300 illustrating an example of inserting a wait statement into a high-level circuit description in order to create sub-function-call-level transactions. In particular, block diagram 1300 shows a high-level description 1310 for a function (e.g., a C, C++, or SystemC function) that is used as an input to a loop flattening procedure 1312. As can be seen, the high-level description 1310 includes a loop 1320 that iterates (here, 1000 times) and in which one or more operations (shown generally as code portion "B") are performed. FIG. 13 also shows modified (transformed) code 1314 output from the loop flattening procedure 1312. During the loop flattening procedure, a wait statement (e.g., wait statement 1322) is inserted into an iteration of the loop 1320. Additionally, and in certain embodiments, the original code is normalized to a standard format for expressing loops. For instance, in the illustrated embodiment, loops expressed in the "for" format (e.g., for (int i=0; i<1000; ++i) are transformed into the "while" format, as shown in modified code 1314. Additionally, in certain embodiments, the original code is rephased in order to save one or more computational iterations. For example, in the illustrated embodiment, the "break" statement can be moved from the beginning of the loop to the end of the loop just before the wait statement. In certain embodiments, the rephasing that is performed is desirably in sync with any rephasing that the HLS synthesis tool performs. For instance, in accordance with particular embodiments of the disclosed technology, any transformation that the synthesis tool performs that alters loop boundaries to the RTL description should be applied similarly to the high-level description during verification.

As a result of the loop flattening procedure 1312, the modified (transformed) code 1314 defines 1000 transactions that can be individually verified by the formal transaction tool: transaction 1 for code portion "A" and "B", transactions 2-999 for iterations of code portion "B", and transaction 1000 for a last iteration of "B" and code portion "C".

Figure 14:
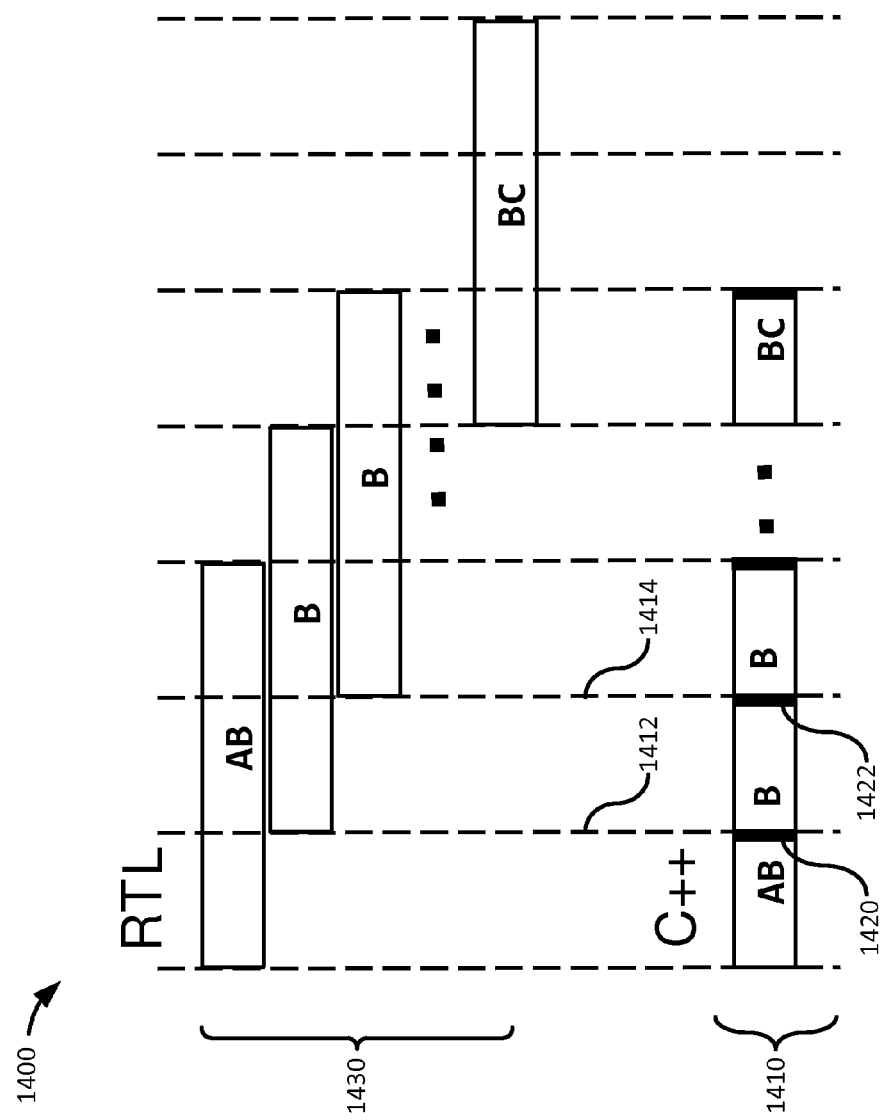
FIG. 14 is a block diagram illustrating the formal verification of the modified code from FIG. 13 against corresponding RTL.

FIG. 14 is a block diagram 1400 illustrating the formal verification of the modified (transformed) code 1314 against corresponding RTL. In FIG. 14, the modified code 1314 is illustrated as a series of transactions 1410 defined by transaction boundaries (two examples of which are shown as boundaries 1412, 1414). In this block diagram, wait statements (two examples of which are schematically shown as wait statements 1420, 1422) are also illustrated as occurring at the end of each transaction. In FIG. 14, the transactions 1410 are compared against corresponding transactions 1430 in the HLS-synthesized RTL code. In this particular embodiment, the pipeline depth of the loop iterations is 3 clock cycles. As will be discussed in more detail below in section III.B.3, certain embodiments of the disclosed technology insert additional wait statements into the high-level description after the loop in order to align the transactions of the high-level description with the corresponding pipelined transactions in the RTL.

Figure 17:
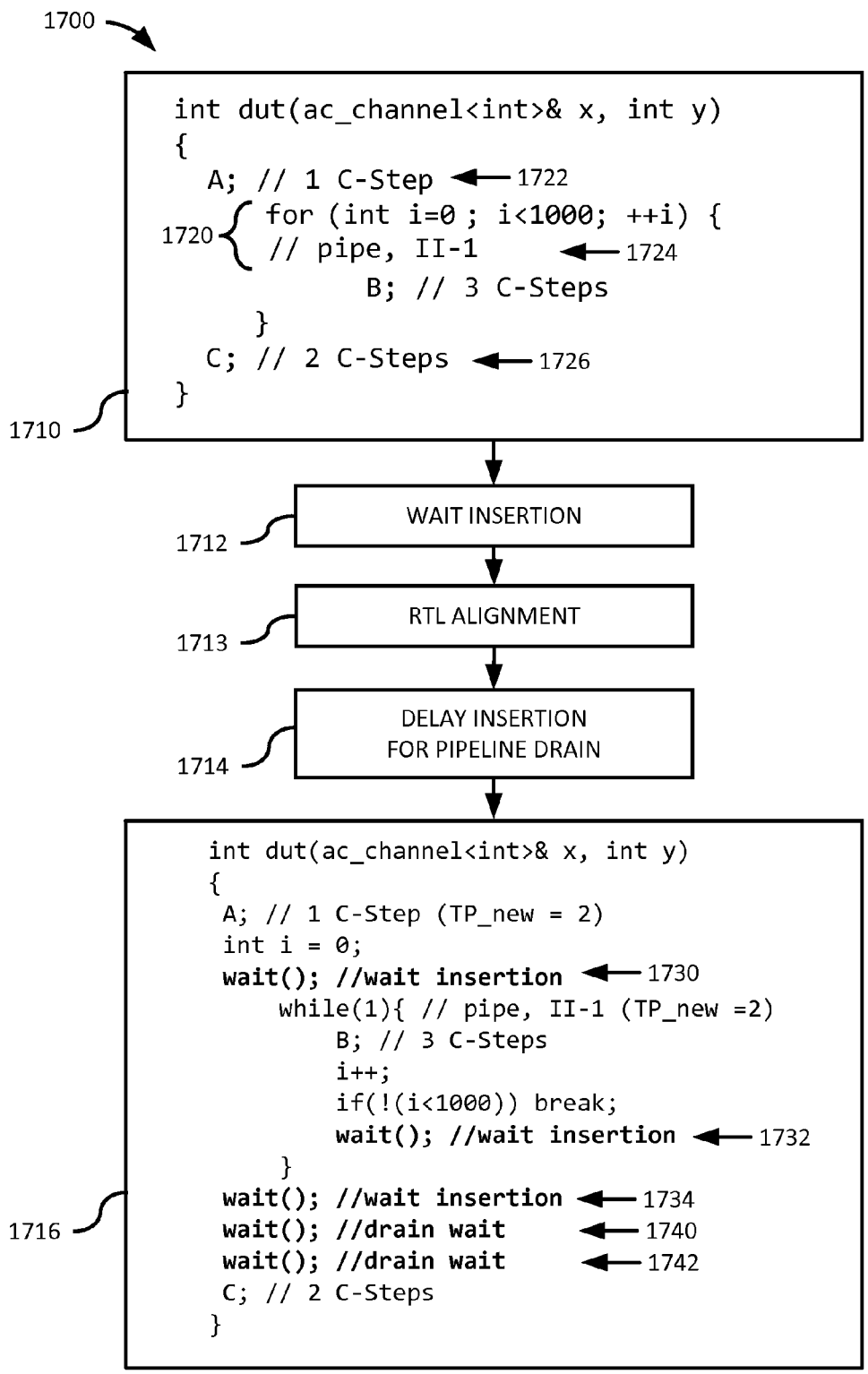
FIG. 17 is a schematic block diagram illustrating an example of inserting statements that create delays into the high-level description in accordance with embodiments of the disclosed technology.

In the example shown in FIGS. 13 and 14, only a single wait statement is added to the end of the loop iteration. In certain embodiments, additional wait statements can be added to create additional transactional boundaries, resulting in a further partitioning of the high-level description into sub-function-call-level transactions. For instance, in the example shown in FIG. 13, wait statements could be inserted after code portion "A" as well as before code portion "C", such that each code portion "A", "B", and "C" is handled in separate transactions. An example of such a modification is shown in FIG. 17 and designated by the comment: "//wait insertion". In particular, FIG. 17 shows an example of a wait insertion procedure in which wait statements are inserted at all loop boundaries (not just at the end of each loop iteration).

In some implementations, whether wait statements are added at the end of the loop iterations in a loop (but not at other loop boundaries) or whether wait statements are added at additional loop boundaries (e.g., all loop boundaries) is controlled by the nature of the loop being analyzed. For example, in one particular implementation, wait statements are added to the end of the loop iteration (but not at other loop boundaries, such as at the beginning of the first iteration or at the end of the last iteration) as in FIG. 13 when the loop being analyzed is a pipelined loop within a pipelined loop. In FIG. 13, for instance, it is assumed that the illustrated function "dut" is itself a loop and is pipelined. More specifically, for many HLS tools (e.g., Catapult), functions are commonly treated as a loop. For instance, a "while" loop is implied around the function by the HLS tool. Pipelining of the function (also referred to as top-level pipelining or pipelining of the top-level loop) can be implemented, for instance, through the use of a synthesis directive provided by the user for the function indicating that the function is to be pipelined. This synthesis directive thus specifies that the virtual top-level "while" loop around the function is pipelined. (For some HLS tools, an explicit "while" loop around the function and an associated synthesis directive are inserted by the user.) By contrast, in FIG. 17, it is assumed that the virtual "while" loop around the function "dut" is not pipelined. For example, in FIG. 17, it is assumed that there is no synthesis directive for the function "dut" specifying the function to be pipelined. Thus, wait statements are added at the loop boundaries (e.g., each transaction is a loop join to loop join transition).

It should also be noted that the described wait insertion technique is not limited to the situation where loops are defined within a function call. Wait statements (or other such statements that create a transactional boundary) can be inserted between code portions that do not define loops, thereby creating transactions at a level granularity smaller than the function-call level in non-loop contexts as well.

III.B.1.b. Example Embodiments

Figure 19:
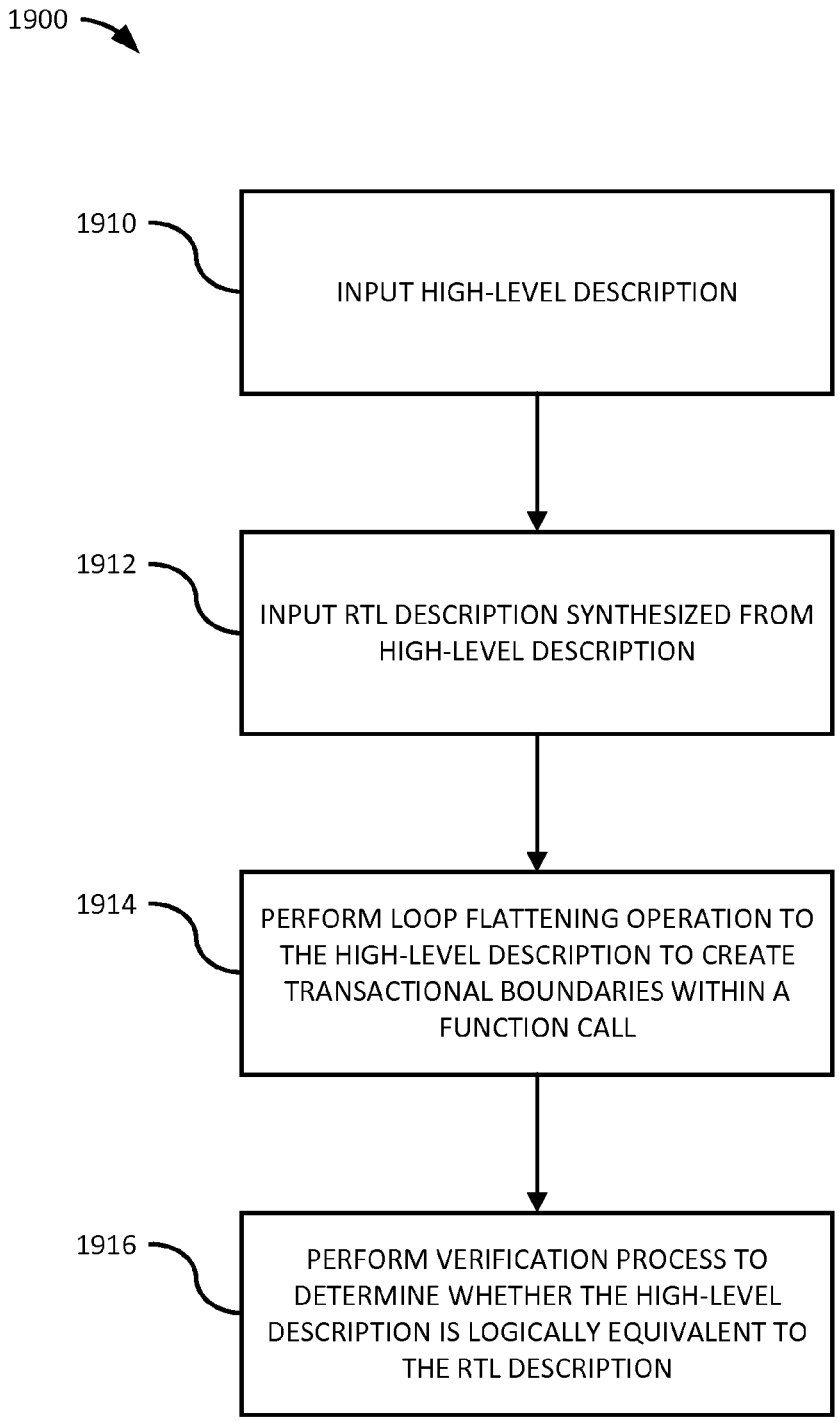
FIG. 19 is a flow chart showing a generalized example embodiment for implementing a loop flattening operation according to the disclosed technology.

FIG. 19 is a flow chart 1900 showing a generalized example embodiment for implementing a loop flattening operation according to the disclosed technology. The particular operations and sequence of operations should not be construed as limiting, as they can be performed alone or in any combination, subcombination, and/or sequence with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 19 can be performed, for example, by one or more specialized electronic design automation (EDA) tools that are adapted to perform and/or support high-level synthesis and/or high-level-synthesis formal verification. Such tool(s) can be used, for instance, as part of a circuit design and/or manufacturing process and be implemented by one or more computing devices as described above. The example embodiments described with respect to or related to FIG. 19 can be used to realize any one or more of the benefits disclosed herein (e.g., scalable verification of practical designs, reduced verification time, reduced computational complexity and overhead, reduced hardware resource usage (such as reduced memory usage), and/or other such improvements to the functioning of a computing system).

At 1910, a high-level description of a circuit design is input (e.g., buffered into memory and/or otherwise prepared for further processing).

At 1912, a register-transfer-level (RTL) description of the circuit design is input (e.g., buffered into memory and/or otherwise prepared for further processing), the RTL description having been synthesized from the high-level description (e.g., using an HLS synthesis tool).

At 1914, a loop flattening operation is performed to the high-level description in which one or more statements that create transactional boundaries are inserted into the high-level description at one or more locations within a function call, thereby transforming the high-level description. The act of performing the loop flattening operation can comprise inserting the one or more statements that create transactional boundaries at an end of an iteration in a loop defined by the high-level description. Further, the one or more statements that create transactional boundaries can be wait statements.

At 1916, a verification process is performed to determine whether the high-level description is logically equivalent to the RTL description. In this embodiment, this process is performed by discretely (individually) verifying transactions from the high-level description that are defined by the transactional boundaries relative to corresponding RTL transactions specified in the RTL description.

Further example implementations and implementation considerations for performing loop flattening and related procedures are presented below in Section IV.B.1.

III.B.2. Selective Stalling of RTL

III.B.2.a. In General

In some cases, during formal verification, the number of clock cycles used to execute RTL transactions may vary from one another. For instance, some transactions on the RTL side of verification may take more clock cycles to complete than others. Further, in some cases, formal verification of multiple transactions is desirably performed so that the beginnings of the high-level description transactions are aligned with the beginnings of the RTL transactions. This section describes embodiments of techniques that can be used to align transactions during formal verification when the execution of the RTL would otherwise move ahead of the corresponding high-level description, creating a misalignment that could affect the verification results.

Figure 15:
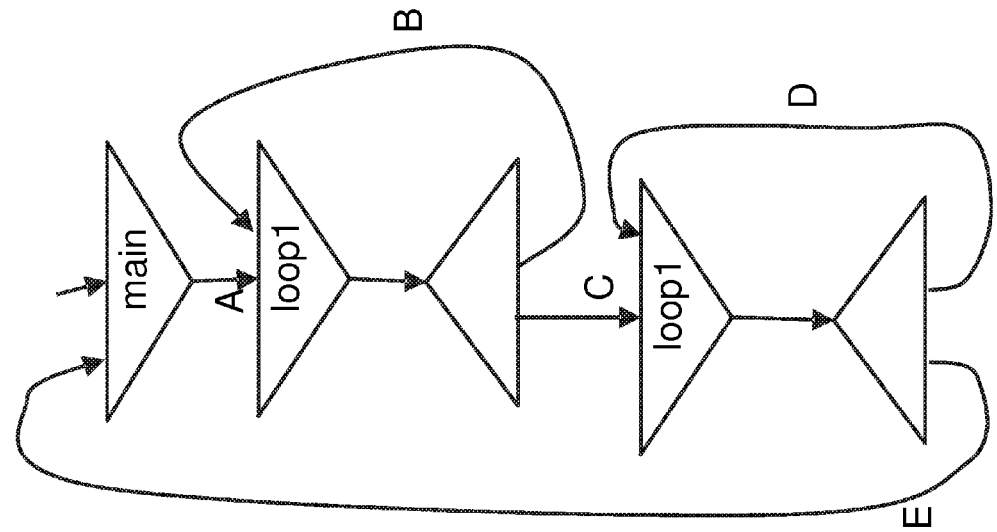
FIG. 15 shows an example of a high-level description together with comments showing the corresponding clock cycles (C-steps) for each of the code portions.

The clock-cycle mismatch between the high-level description and the RTL description during formal verification can result from a variety of causes. In one case, the mismatch can be the result of a requirement by the formal verification tool that the transactions being verified have a constant throughput. For instance, FIG. 15 shows an example of high-level description 1500 together with comments showing the corresponding clock cycles (C-steps) for each of code portions "A", "B", "C", "D", and "E". In general, the C-steps illustrated in FIG. 15 are RTL-side control units and designate the number of clock cycles used to perform the operations upon execution of the corresponding RTL. The comments also show that "loop1" is a pipelined loop ("pipe"), where each pipeline takes 3 clock cycles to complete ("3 C-steps"). Further, the comments show that "loop1" has an initiation interval ("II") of 1 (shown by "II-1"), meaning that the next pipeline can begin (or be initiated) after a 1 clock cycle without any resource contention, data dependency, or other such conflict requiring the next pipeline to start at a later clock cycle.

As noted, certain formal verification tools may have a requirement that the throughput of each transaction be constant. Thus, in certain embodiments, the RTL-side transaction requiring the greatest number of clock cycles is identified, and the other transactions are subsequently treated as requiring that number of clock cycles during formal verification. On the high-level-description side, wait statements may introduce clock cycle considerations. As explained below, there may be instances where the numbers of wait statements along various paths in various transactions in the high-level description are desirably balanced in order to maintain alignment during formal verification.

For code portions of a function that are outside of a loop or for non-pipelined loops, the number of clock cycles (C-steps) can be used as the relevant measure, whereas for pipelined loops within a function, the initiation interval can be used as the relevant measure. In the illustrated example, code portion "C" and code portion "D" in non-pipelined "loop2" are executed over two clock cycles and define the greatest number of clock cycles for executing a transaction in the description to be verified. The other out-of-loop code portions use only 1 clock cycle, and the initiation interval (II) of the pipelined "loop1" is also one clock cycle 1 (even though the number of clock cycles for a given pipeline is 3 clock cycles). This result for loop1 stems from the nature of a pipelined loop, where computational processing can be broken down into independent stages that allow at least some partially concurrent processing for data from different circuit states. In such cases, the initiation interval (not the pipeline depth) specifies the number of clock cycles used for determining throughput.

During formal verification of the corresponding RTL description, execution of the RTL can be modified so that the RTL transactions have a constant throughput. This can help align the transactions in the RTL description to the transactions in the high-level description. Such alignment can be achieved in a variety of manners. In particular embodiments of the disclosed technology, the alignment is obtained by selectively adding stalls to the execution of the RTL description during formal verification. The stalls can be implemented, for example, by controlling execution of the RTL description during formal verification with a transactor and stalling further RTL execution (e.g., by suppressing the clock controlling state advancement in the RTL) until execution of the RTL has a constant throughput and is aligned again with the high-level description.

Figure 16:
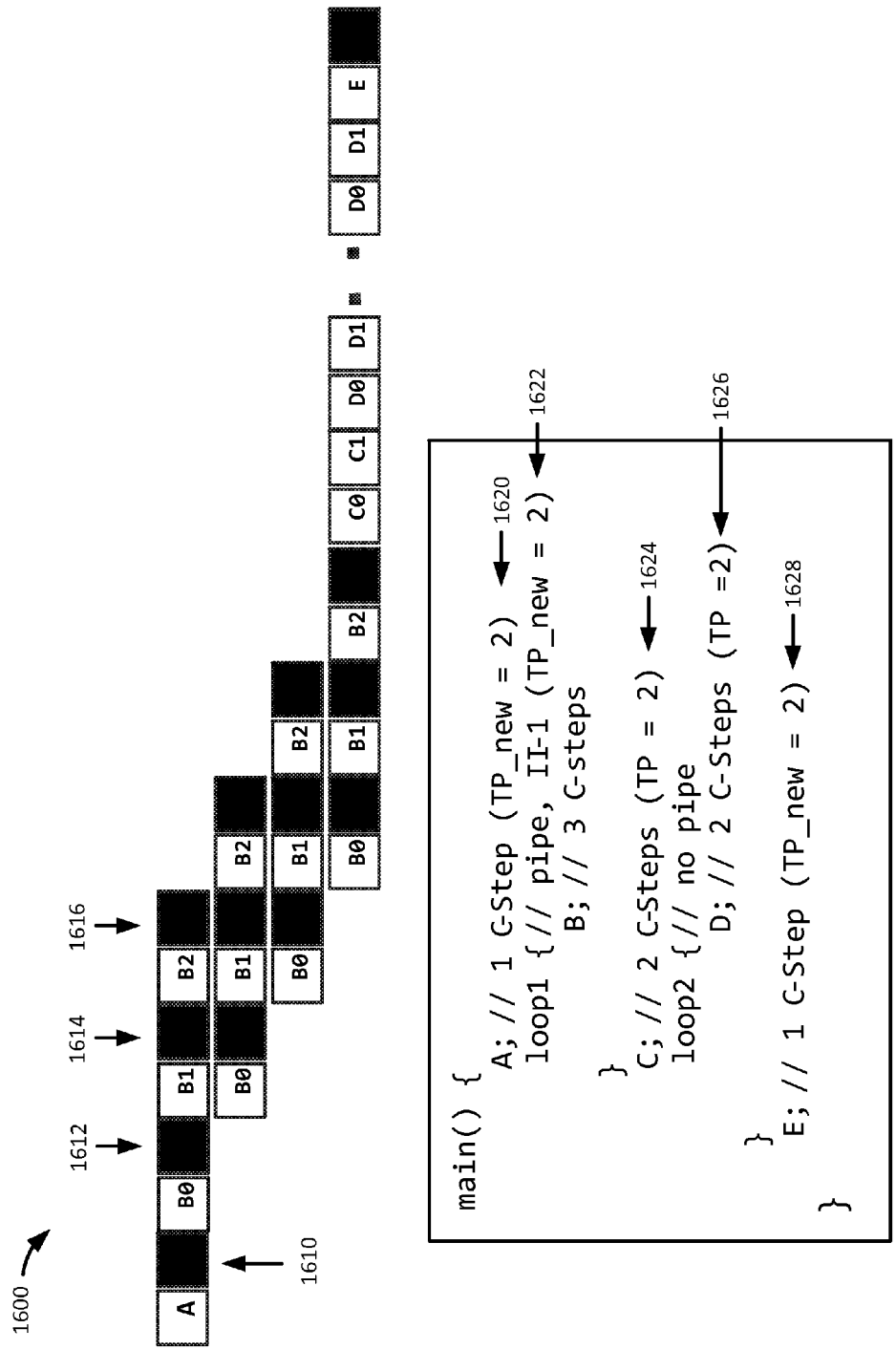
FIG. 16 illustrates example stalls to be added during RTL execution in order to obtain transaction alignment in accordance with embodiments of the disclosed technology.

FIG. 16 illustrates the stalls to be added during RTL execution in order to obtain transaction alignment. In particular, FIG. 16 illustrates that the corresponding RTL for code portions "A" and iterations of code portion "B" have stalls added to create the desired alignment. In FIG. 16, four example stalls 1610, 1612, 1614, 1616 are illustrated. As noted, the added stalls can be implemented by stalling execution of the RTL during the formal verification so that the illustrated stall are effectively realized and so that the RTL throughput is constant during RTL execution.

Also shown in FIG. 16 is the code from FIG. 15 with further comments showing that code portion "A" has a modified throughput of 2 (shown at 1620 ("TP_new=2")), that each pipeline stage of the pipeline for code portion "B" has a modified throughput of 2 (shown at 1622 ("TP_new=2")), that code portions "C" and "D" have their original throughputs of 2 (shown at 1624, 1626), and that code portion "E" has a modified throughput of 2 (shown at 1628 ("TP_new=2")).

III.B.2.b. Example Embodiments

Figure 20:
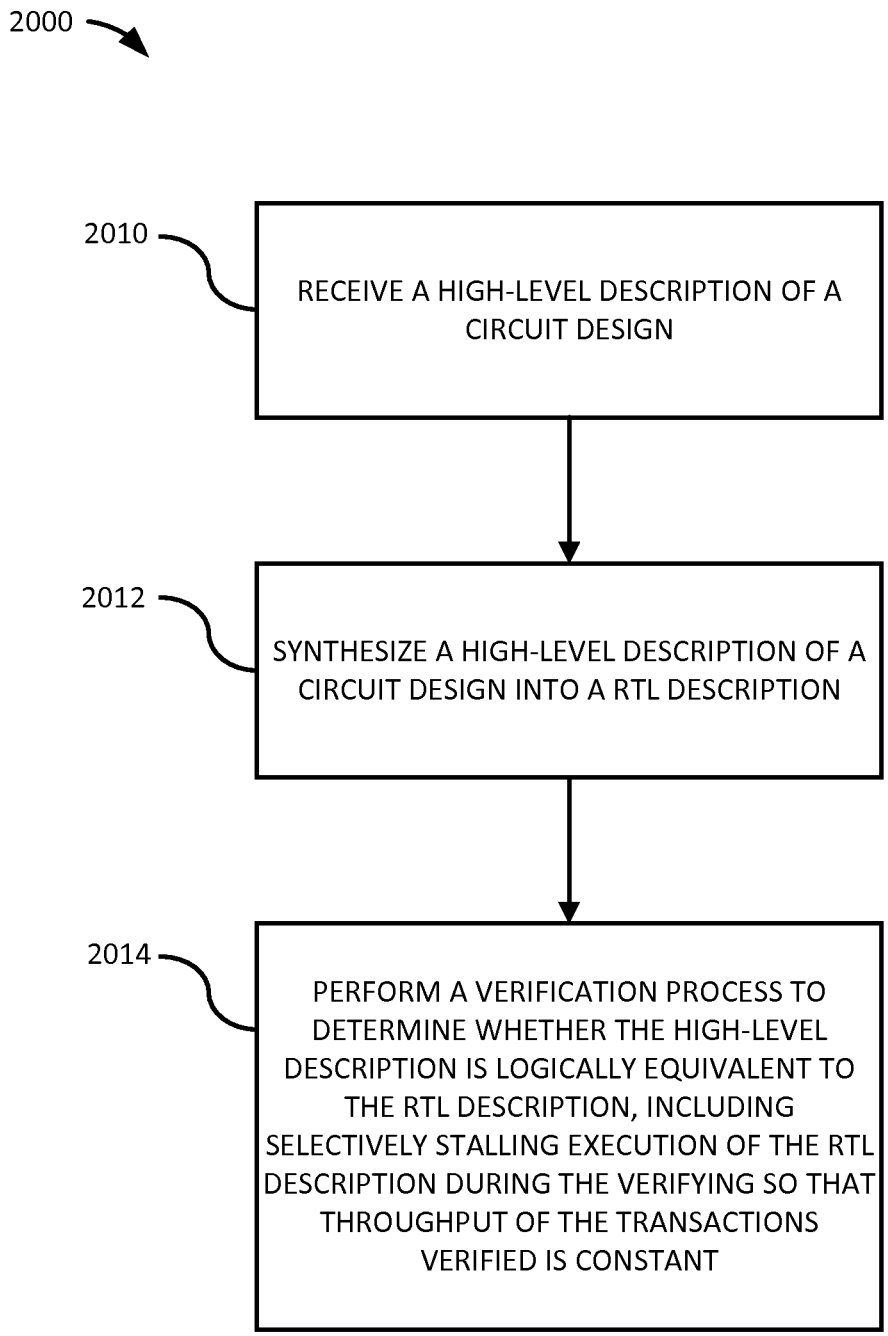
FIG. 20 is a flow chart showing a generalized example embodiment for implementing a technique for selectively stalling transactions of an RTL description during formal verification.

FIG. 20 is a flow chart 2000 showing a generalized example embodiment for implementing a technique for selectively stalling transactions of an RTL description during formal verification. The particular operations or sequence of operations should not be construed as limiting, as they can be performed alone or in any combination or subcombination with one another. Additionally, the illustrated operations can be performed together with one or more other operations. Still further, the identified operations need not be performed by a single software module, but can be implemented using multiple modules or software tools, which collectively perform the illustrated method. The example embodiment can be performed, for example, by one or more specialized electronic design automation (EDA) tools that are adapted to perform and/or support high-level synthesis and/or high-level-synthesis formal verification. Such tool(s) can be used, for instance, as part of a circuit design and/or manufacturing process and be implemented by one or more computing devices as described above. The example embodiments described with respect to or related to FIG. 20 can be used to realize any one or more of the benefits disclosed herein (e.g., scalable verification of practical designs, reduced verification time, reduced computational complexity and overhead, reduced hardware resource usage (such as reduced memory usage), and/or other such improvements to the functioning of a computing system).

At 2010, a high-level description of a circuit design is input (e.g., buffered into memory and/or otherwise prepared for further processing). The high-level description can be a C, C++ or SystemC description of the circuit design.

At 2012, the high-level description of a circuit design is synthesized into a register-transfer level (RTL) description of the circuit design (e.g., using an HLS tool).

At 2014, a verification process is performed to determine whether the high-level description is logically equivalent to the RTL description. In this embodiment, the verifying comprises selectively stalling execution of the RTL description during the verifying so that the RTL transactions have a constant throughput. The selectively stalling can further be performed so that the transactions in the high-level description are aligned with corresponding transactions in the RTL description during the verifying. The stalling can comprise delaying application of a clock signal that would otherwise advance execution of the RTL description during the verifying.

As noted, the transactions in the high-level description and the corresponding transactions in the RTL description can correspond to multiple transactions defined within a single function call of the high-level description. The RTL description can include one or more pipelined loops that remain pipelined and are not unrolled during the verifying. Each iteration of the one or more pipelined loops can be treated as a separate transaction when verified by the logic equivalence checking tool. Further, one or more optimization hints can be generated as part of the synthesizing, the optimization hints describing one or more optimizations performed during the synthesizing. In such cases, the verification process can further comprise formally verifying the optimizations performed during the synthesizing using the optimization hints.

III.B.3. Inserting Delay to Compensate for Pipeline Drain

III.B.3.a. In General

In some cases, formal verification of iterations in a loop is desirably performed so that the loop iterations between the high-level description and the RTL description are completed before a next transaction in the description is verified. This section describes embodiments of techniques that can be used to align transactions for loop iterations of a loop of the high-level description with corresponding transactions in a pipelined version of the loop in the RTL description. For instance, the pipelining of the loop in the RTL description may create an alignment issue between the high-level description and the RTL description during the verification process. By inserting one or more statements that create delay in the high-level description (e.g., one or more wait statements or other statements that selectively stall the high-level description) alignment between the two descriptions can be maintained during the verification process.

In certain embodiments, statements that create delay in the execution of the high-level description are selectively inserted into the high-level description so that execution of a loop in the high-level description is aligned with a pipelined version of the loop in the corresponding RTL description. In particular implementations, the delay can be created by inserting one or more wait statements into the high-level description. In certain implementations, the wait statements are added so that they are executed after a last iteration of the relevant loop and before execution of a next code portion. In other embodiments, the delay is created by freezing the high-level description (e.g., through one or more of a stall transactor or disablement of probe maps) until execution of the high-level description is aligned again with the RTL description FIG. 17 is a schematic block diagram 1700 illustrating an example of inserting into the high-level description statements that create transaction boundaries and statements that create delays to compensate for pipeline drain. In particular, block diagram 1700 shows a high-level description 1710 for a function (e.g., a C, C++, or SystemC function) that is used as input to a delay insertion procedure 1714 (to allow for pipeline flushing or drain) and, in the illustrated embodiment, a wait insertion procedure 1712 and RTL alignment procedure 1713 as well. In this example, the illustrated function "dut" includes a pipelined loop 1720 but is a function that itself is not pipelined (e.g., the function "dut" does not have a synthesis directive associated with it indicating that the function is to be pipelined). Thus, the pipelined loop 1720 is not a pipelined loop within a pipelined loop. In this case, and according to certain embodiments of the disclosed technology, the wait insertion procedure 1712 comprises inserting waits at loop iteration boundaries. These wait statements create transaction boundaries for the microtransactions within function "dut". In particular, wait statement 1730 is inserted at the boundary of code portion "A" and code portion "B", wait statement 1732 is inserted at the boundary of the code portion "B" iterations, and wait statement 1734 is inserted at the boundary of the code portion "B" and code portion "C". Further, if code portion "B" comprises further pipelined loops within it, then a loop flattening procedure as described above could additionally be performed for the iterations of that nested pipelined loop. The RTL throughput may also be analyzed and any appropriate adjustments made to the RTL (e.g., transactor insertion) in order to implement RTL alignment as described above.

As can be seen, the high-level description 1710 includes a loop 1720 that iterates (here, 1000 times) and in which one or more operations (shown generally as code portion "B") are performed. Further, high-level description 1710 includes a code portion "A" which is originally specified for processing in 1 clock cycle (shown by the comment at 1722); an iterative code portion "B", which is originally specified as a pipelined loop with an initiation interval of 1 and a pipeline depth of 3 clock cycles (shown by the comment at 1724), and a code portion "C" which is originally specified for processing in 2 clock cycles (shown by the comment at 1726). The number of clock cycles designated for each code portion can be initially determined, for example, by the HLS synthesis tool, which may perform some initial scheduling. For example, the HLS tool can determine the number of clock cycles each code segment requires to execute in the RTL. This information can be provided during the "scheduling" phase of the HLS tool.

FIG. 17 also shows modified (transformed) code 1716 output from the wait insertion procedure 1712. During the wait insertion procedure 1712, wait statements (e.g., wait statements 1730, 1732, 1734) are inserted to create separate transactions for each of code portions "A", "B", and "C". This wait insertion procedure 1712 thus involves inserting wait statements at all loop boundaries or, stated differently, each transaction is a loop join to loop join transition (as illustrated by the control flow graph of FIG. 15). As noted above, for certain embodiments, this type of wait insertion may depend on whether the loop being analyzed is a pipelined loop within another pipelined loop (a nested pipelined loop) or a pipelined loop within a non-pipelined loop. In FIG. 17, it is assumed that the function "dut", which comprises code portions "A", "B", and "C", is not pipelined. Thus, in the illustrated implementation, wait statements are inserted at all loop boundaries, and not just between iterations of a pipelined loop (e.g., as illustrated in FIG. 13).

Additionally, in certain embodiments, the original code is normalized to a standard format for expressing loops and rephased, as discussed above. Further, in the illustrated embodiment, the original code is analyzed in an RTL alignment procedure 1713 to identify how the RTL is to be executed during verification and so that the transactions evaluated during formal verification have a constant throughput. The RTL alignment procedure 1713 is not necessarily performed at this stage. Further, although this evaluation does not necessarily modify the RTL description or the high-level description itself, the results of the evaluation are shown for illustrative purposes in the modified code 1716 as modifications to the throughput ("TP_new=2"). As explained above in Section III.B.2, RTL alignment as performed at 1713 can be implemented by selectively stalling execution of the RTL description during verification through one or more stalls.

The delay insertion to compensate for pipeline drain process 1714 comprises modifying the high-level description to insert one or more statements that delay the high-level description such that it is aligned with the RTL after execution of a pipelined loop in the RTL is complete. In one exemplary embodiment, the delay insertion process is implemented by inserting a number of wait statements into the high-level description, where the number of wait statements is determined by:

$$\text{ceil}\{(D-II)\div II\} \tag{1}$$

where D is the pipeline depth and II is the initiation interval.

In FIG. 17, this alignment is accomplished by inserting two wait statements (wait statements 1740, 1742, which are designated as "drain waits") at the end of the loop in which code portion "B" is iterated. In this regard, the pipeline depth is 3, and the initiation interval is 1, which gives 2 wait statements when applying Formula (1):

$$\text{ceil}\{(3-1)\div 1\} \tag{2}$$

Furthermore, in the illustrated embodiment, the added wait statements are inserted after the wait statement that is added to create a transaction boundary, but in practice these wait statements can be ordered in any sequence, as the goal of alignment will still be accomplished.

Figure 18:
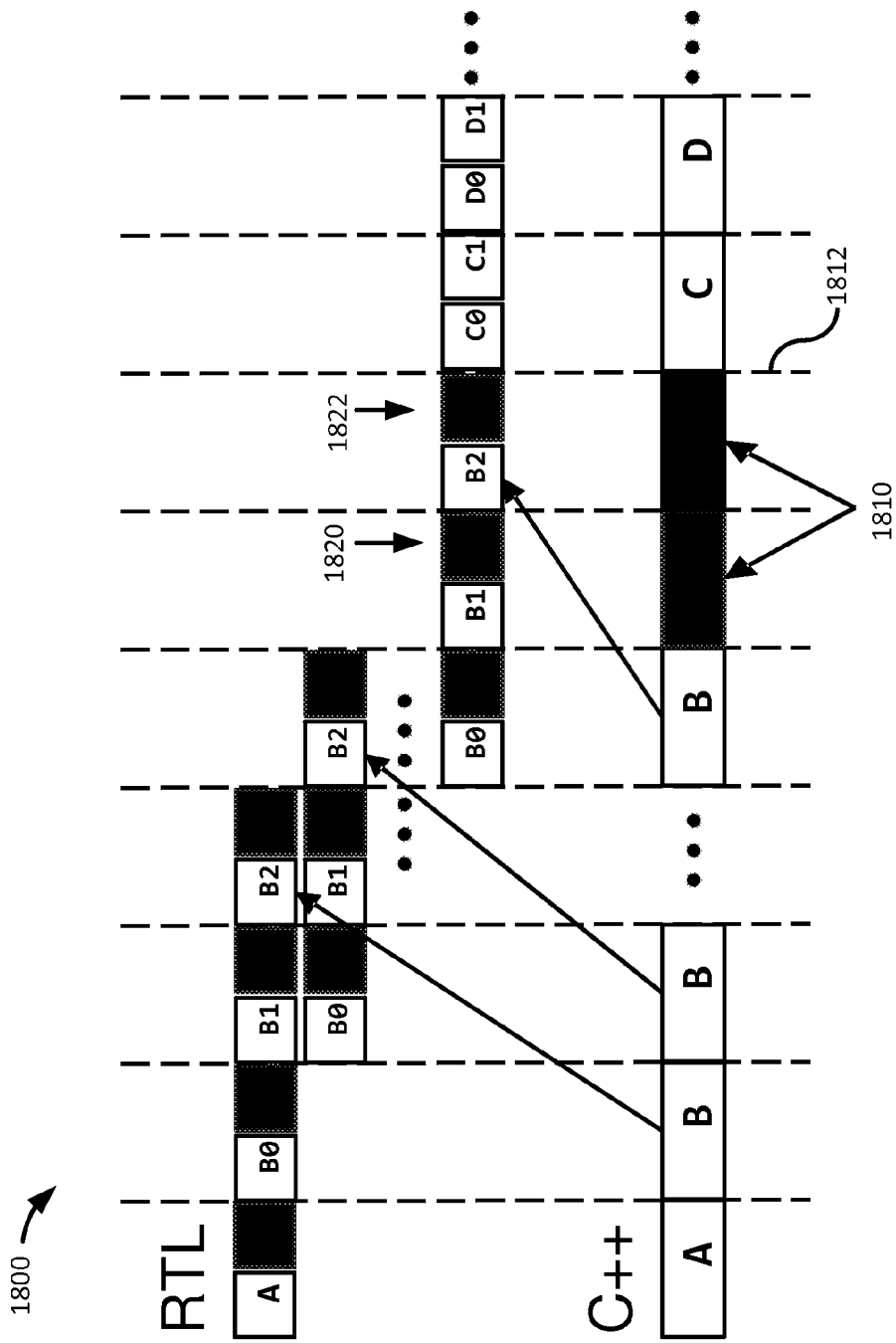
FIG. 18 is a block diagram illustrating the effect of the one or more statements that create delay inserted to the high-level description according to the delay insertion process as well as the effect of the stalls implemented during RTL execution in order to obtain constant RTL throughput and transaction alignment during formal verification in accordance with embodiments of the disclosed technology.

FIG. 18 is a block diagram 1800 illustrating the effect of the one or more statements that create delay inserted to the high-level description according to the delay insertion process (as described in this section) as well as the effect of the stalls implemented during RTL execution in order to obtain constant RTL throughput and transaction alignment during formal verification (as described in the previous section III.B.2). In particular, FIG. 18 illustrates the effect of statements that create a delay that are inserted into the high-level description in order to align the verification of a loop in the high-level description with a corresponding pipelined version of the loop in the RTL description. For instance, in the illustrated embodiment, a delay 1810 is realized in the high-level description at the completion of the last iteration in the loop in which code portion "B" is performed so that the pipelined operations in the corresponding RTL are completed (e.g., the pipeline drain is completed or flushed) and so that the subsequent transaction (for code portion "C") in the high-level description is aligned with the corresponding transaction in the RTL description (as shown at transaction boundary 1812). As explained above, in certain embodiments, the delay 1810 has the form of one or more wait statements inserted into the high-level description. The delay can be implemented in various other manners as well. For example, transactors that effectively "freeze" or stall the high-level description during formal verification can be inserted into the design and used to provide the desired delay. Further, FIG. 18 also shows stalls (such as example stalls 1820, 1822) that are implemented during execution of the RTL description to achieve a constant throughput during formal verification. Examples of such stalls are described, for example, in section III.B.2 above.

III.B.3.b. Example Embodiments

Figure 21:
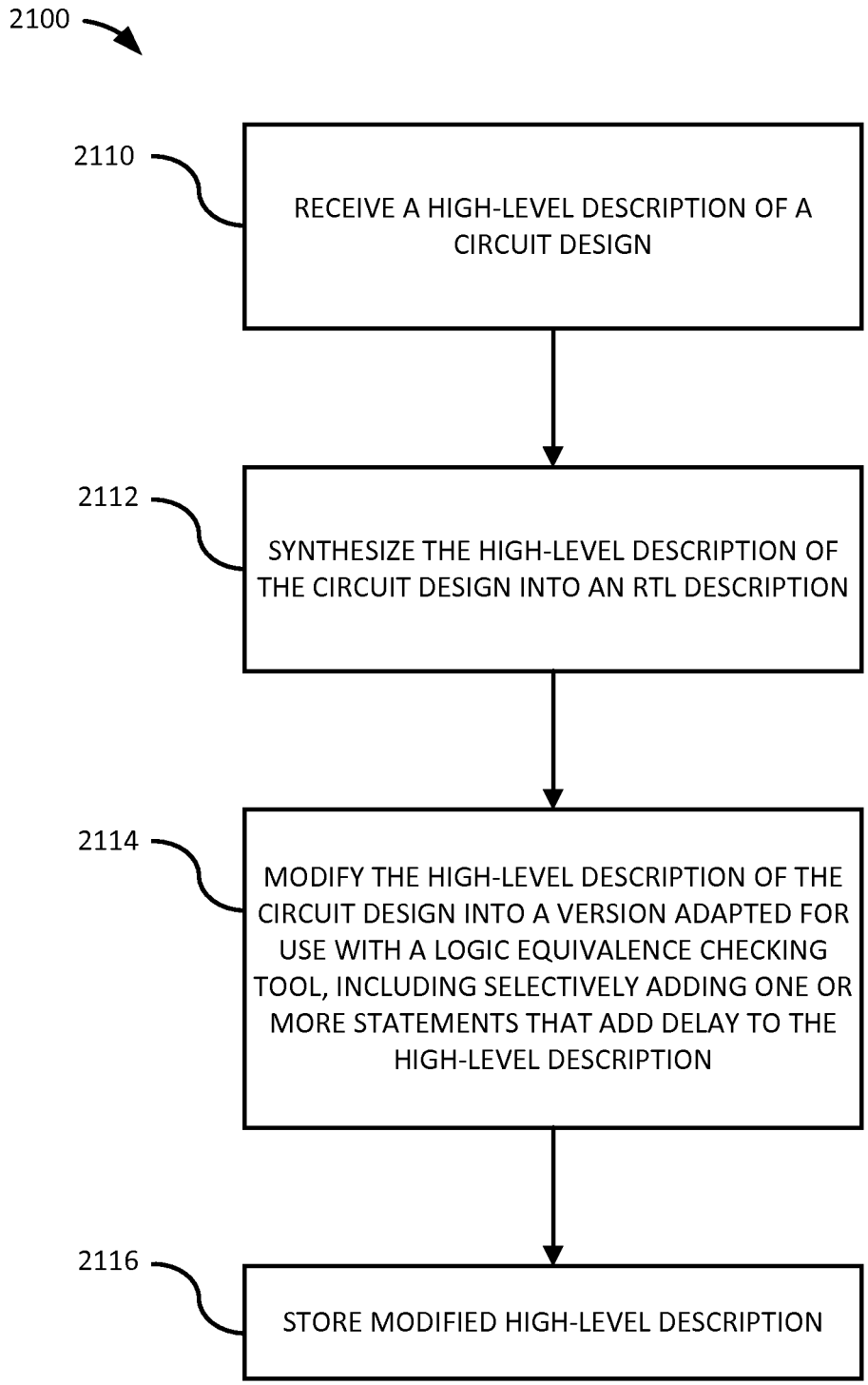
FIG. 21 is a flow chart showing a generalized example embodiment for implementing a technique for delay insertion according to the disclosed technology.

FIG. 21 is a flow chart 2100 showing a generalized example embodiment for implementing a technique for delay insertion according to the disclosed technology. The particular operations or sequence of operations should not be construed as limiting, as they can be performed alone or in any combination or subcombination with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 21 can be performed, for example, by one or more specialized electronic design automation (EDA) tools that are adapted to perform and/or support high-level synthesis and/or high-level-synthesis formal verification. Such tool(s) can be used, for instance, as part of a circuit design and/or manufacturing process and be implemented by one or more computing devices as described above. The example embodiments described with respect to or related to FIG. 21 can be used to realize any one or more of the benefits disclosed herein (e.g., scalable verification of practical designs, reduced verification time, reduced computational complexity and overhead, reduced hardware resource usage (such as reduced memory usage), and/or other such improvements to the functioning of a computing system).

At 2110, a high-level description of a circuit design is input (e.g., buffered into memory and/or otherwise prepared for further processing). The high-level description can be a C, C++ or SystemC description of the circuit design.

At 2112, the high-level description of the circuit design is synthesized into a register-transfer level (RTL) description of the circuit design (e.g., using an HLS tool).

At 2114, the high-level description of the circuit design is modified into a modified version of the high-level description adapted for use with a logic equivalence checking tool. In the illustrated embodiment, the modifying includes selectively adding one or more statements that add delay to the high-level description, the number of statements added being selected so that a transaction boundary for a loop specified in the high-level description is aligned with a transaction boundary for a pipelined version of the loop specified in the RTL description during logic equivalence checking.

At 2116, the modified high-level description is stored (e.g., on one or more tangible non-transitory computer-readable medium). The modified high-level description can then be used during microtransaction-based formal verification.

The statements that add delay can be wait statements. The number of statements added can be selected so that logic equivalence checking of iterations in the loop as specified in the high-level design relative to iterations in the pipelined version of the loop as specified in the RTL description of the circuit design is completed before logic equivalence checking of other transactions in the high-level description and the RTL description is performed. The number of statements added to the high-level description can be a function of the pipeline depth and the initiation interval of the pipelined version of the loop specified in the RTL description. For example, the number of statements added to the high-level description can be computed according to Formula (1) above (ceil{(D−II)÷II}), where D is the pipeline depth and II is the initiation interval. The statements can be added after an end of the loop in the high-level description.

Further example implementations and implementation considerations for accounting for pipeline drain during verification are presented below in Section IV.A.

III.B.4. Probes and Probe Mapping

III.B.4.a. In General

During the formal verification process, it is often desirable to have intermediate equivalence points in the high-level description of a circuit design that map to corresponding points in the RTL. This can be especially true in a verification environment that uses sub-function-call level transactions (microtransactions), as in embodiments of the disclosed technology. In such environments, the microtransactions create situations where data that would normally not appear at the boundaries of a function call transaction do appear at the boundaries of one or more microtransactions. According to certain exemplary embodiments of the disclosed technology, data that holds state (holds "life") across a microtransaction boundary is desirably maintained for use with the next microtransaction and mapped between the high-level description and the RTL so that it can be used by the formal verification tool as an intermediate equivalence point. The RTL of the design, however, may not natively have any logic or memory elements (e.g., flip flops) defined that would enable such equivalence points. Further, during synthesis, design elements that could maintain the data across transaction boundaries may be optimized away, resulting in a potential disconnect between the RTL and the high-level description that could render the formal verification process inoperative.

To enable the creation of usable mappings between the RTL and the high-level description, one or more probes can be inserted into the RTL to help recreate the data used by a formal verification tool during verification at the microtransaction level. As more fully explained below, different types of probes may be inserted into the design, such as data probes and control probes. In general, a data probe is configured to capture the value of any variable at a point in the high-level description to recreate the value in the RTL design. The point can be selected to correspond to the boundary of a microtransaction. For example, in certain embodiments of the disclosed technology, data probes are inserted into the high-level description (or an HLS-tool-specific intermediate format of the high-level description) in order to capture the values of the variables in the high-level description at points in the high-level description (e.g., code points in the C, C++, SystemC description) that correspond to the transaction boundaries.

For instance, an HLS synthesis tool synthesizes these monitors, or data probes, to compute the values corresponding to the original C variables at the code points that correspond to the transaction boundaries. A data probe can take the form of combinational logic configured to generate the value of the corresponding variable from the high-level description at the code point corresponding to the transaction boundary. Thus, the data probe provides the state of the probed variable at the transaction boundary. In addition to these values, there are other invariants that can be synthesized by the HLS synthesis tool, or inferred by the verification tool, that are desirably probed in order to make the induction performed by the formal verification tool efficient. Control probes can also be inserted into both the high-level description and the RTL description. Control probes can be configured to produce a signal that toggles when the control probe is being executed, thus providing an indication of which portion of the high-level and RTL design is being executed at a given moment, and thereby providing useful data to the formal verification tool that can be used to align the transactions.

Probe maps can then be generated to map the probed points in the RTL description to the corresponding points in the high-level description (e.g., data probe maps, and/or control probe maps can be generated). For example, a flop-to-variable map can be generated for mapping data probe values back to the high-level description. Such probe maps are used during the verification process to help ensure that the verification is performed properly and that the transactions being verified are aligned with one another. In particular embodiments, providing detailed intermediate maps setup appropriate fine grained invariants for induction. Such maps are very helpful for formal verification techniques based on induction, which are among the most important formal verification techniques, and provide effective inductive invariants for use in such techniques. Further, the maps aid in the scalability of the disclosed verification techniques.

In certain embodiments, the probes are not part of the main design and instead are part of side logic that is used to enable the formal verification process. After high-level synthesis and after formal verification, the probes that are not part of the main design and can be optimized away during the logic synthesis phase or removed prior to logic synthesis. The probes can be automatically inserted (e.g., using a probe insertion program or algorithm), manually added through specific probe declarations provided by the user, or any combination thereof. For instance, in certain embodiments, the variables in a high-level description of a circuit design are analyzed to identify which variables are going to hold state across microtransaction boundaries (e.g., across loop boundaries) and high-level synthesis is controlled so that the resulting RTL includes probes for the identified variables. Such probes are referred to herein as "data probes". Further, some variables are declared as having persistent values (e.g., across function calls). Such variables can also be probed using data probes. In certain embodiments, probes can be inserted into the design and used to perform functions other than just to capture the data value of a variable. For instance, probes can be inserted that indicate the execution state of the design and that can be used to align the state machine between the high-level description and the RTL during verification. Such probes are referred to herein as "control probes".

III.B.4.b. Example Embodiments

Figure 22:
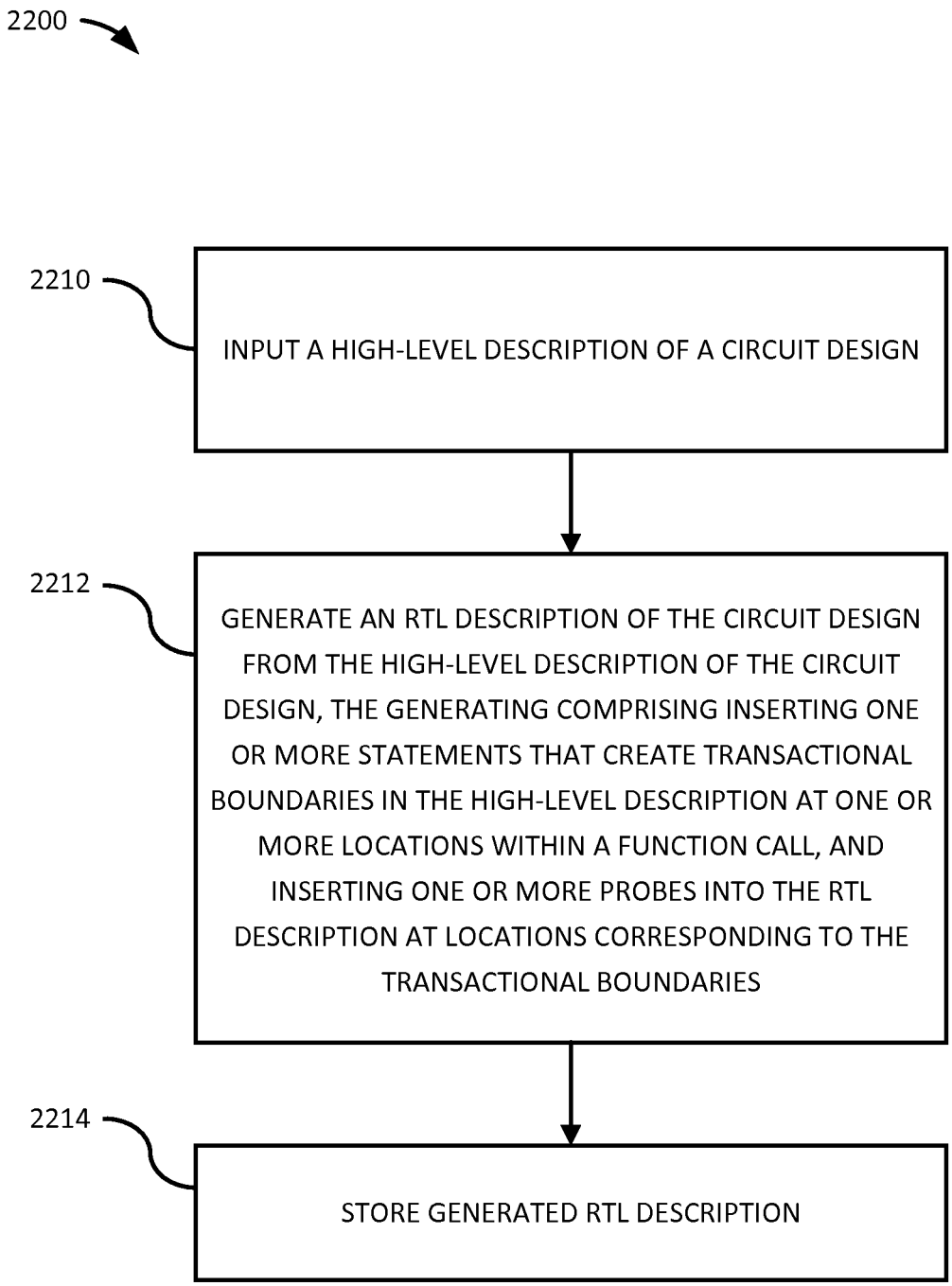
FIG. 22 is a flow chart showing a generalized example embodiment for implementing a technique for probe insertion according to the disclosed technology.

FIG. 22 is a flow chart 2200 showing a generalized example embodiment for implementing a technique for probe insertion according to the disclosed technology. The particular operations or sequence of operations should not be construed as limiting, as they can be performed alone or in any combination or subcombination with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 22 can be implemented, for example, by one or more specialized electronic design automation (EDA) tools that are adapted to perform and/or support high-level synthesis and/or high-level-synthesis formal verification. Such tool(s) can be used, for instance, as part of a circuit design and/or manufacturing process and be implemented by one or more computing devices as described above. The example embodiments described with respect to or related to FIG. 22 can be used to realize any one or more of the benefits disclosed herein (e.g., scalable verification of practical designs, reduced verification time, reduced computational complexity and overhead, reduced hardware resource usage (such as reduced memory usage), and/or other such improvements to the functioning of a computing system).

At 2210, a high-level description of a circuit design is input (e.g., buffered into memory and/or otherwise prepared for further processing). The high-level description can be a C, C++ or SystemC description of the circuit design.

At 2212, a register-transfer-level (RTL) description of the circuit design is generated from the high-level description of the circuit design (e.g., by an HLS tool). In the illustrated embodiment, the generating includes (a) inserting one or more statements that create transactional boundaries in the high-level description at one or more locations within a function call, and (b) inserting one or more probes into the RTL description at locations corresponding to the transactional boundaries in the high-level description.

At 2214, the generated RTL description is stored (e.g., on one or more tangible non-transitory computer-readable medium). The RTL description can then be used during microtransaction-based formal verification.

In certain embodiments, the method further comprises verifying whether the high-level description is logically equivalent to the RTL description by independently verifying transactions from the high-level description that are defined by the transactional boundaries relative to corresponding RTL transactions specified in the RTL description. In such embodiments, the verifying can be performed using data from the probes in the RTL description. Additionally, in such embodiments, one or more optimization hints can be generated (the optimization hints describing one or more optimizations performed during the generating of the RTL description) and the verifying can comprise formally verifying the optimizations using the optimization hints.

In further embodiments, the one or more probes include one or more data probes that store state values of variables in the circuit design at the transactional boundaries, and the method further comprises generating data probe maps that indicate a correspondence relationship between the data probes and the variables in the high-level description. In some embodiments, the inserting the one or more probes comprises inserting: (a) at least one data probe configured to indicate state data of variables in the circuit design at a respective one of the transactional boundaries; and/or (b) at least one control probe configured to indicate when a loop in the RTL description is being executed. Still further, in other embodiments, the inserting one or more probes comprises inserting at least one each of a data probe and a control probe. In such embodiments, the at least one data probe can comprise combinational logic configured to provide state data of at least one variable in the circuit design at the respective one of the transactional boundaries. In particular embodiments, the inserting the one or more probes comprises inserting at least one control probe configured to indicate when a loop in the RTL description is being executed, and the method further comprises inserting at least one corresponding control probe into the high-level description of the circuit design. In such embodiments, the method can further comprise verifying whether the high-level description is logically equivalent to the RTL description by independently verifying transactions from the high-level description that are defined by the transactional boundaries relative to corresponding RTL transactions specified in the RTL description, and the verifying can be performed using data from the control probes in the RTL description and the corresponding control probes in the high-level description to coordinate and align execution of the high-level description and the RTL description during the verifying. In still other embodiments, the inserting the one or more probes into the RTL description comprises inserting probes according to a set of one or more probe generation rules, and removing redundant ones of the probes according to a set of one or more probe removal rules.

Further example implementations and implementation considerations for probe and probe map generation are presented below in Section IV.B.

III.B.5. Wait Balancing

III.B.5.a. In General

In some cases, multiple wait statements may exist within the transaction boundaries of a single transaction. For instance, during the verification process, there may be certain operations or elements that take one or more additional clock cycles to execute. Additional wait statements may be inserted into the design by the verification adapter to allow for such operations (e.g., verification adapters for channel reads or writes, such as AC channel reads or writes). These additional wait statements can therefore be thought of as part of the verification model. Still further, depending on the control flow statements in the high-level descriptions, paths within a given transaction may traverse paths with different numbers of wait statements. Thus, each transaction can have different numbers of waits between each other and around the different paths within a transaction. Each transaction can therefore have its own maximum number of waits.

Further, in particular implementations, the formal verification tool may have a requirement that the transactions being verified have a constant throughput. The possibility for transactions to have different numbers of waits along different paths thus creates the potential for the high-level description to become misaligned with the RTL description during verification by the formal verification tool. To address the issue, embodiments of the disclosed technology implement a wait balancing technique that balances the waits along all possible paths of the transactions being verified so that the transactions of the high-level description have a constant throughput.

For example, in certain embodiments, wait balancing comprises finding the maximum throughput along all paths, and balancing all paths to this throughput. For example, once the throughput is found, the high-level description can be modified such that each path has the desired number of waits (e.g., the maximum number of waits). This balancing can be accomplished, for instance, by inserting code for a counter into a transaction, where the counter is configured to count the number of waits encountered, and by also inserting a while loop that contains a wait statement and that is further configured to repeat until the desired number of wait statements has been reached. For instance, once the desired number of wait statements is encountered for a transaction (as counted by the counter), the while loop can break and the transaction boundary can be reached.

III.B.6. Canonical Names

In general, in order to help implement aspects of the disclosed technology, it is desirable for the formal verification tool and the HLS tool to be able to identify and communicate various objects from the high-level description (e.g., the C, C++, or SystemC designs) with one another. To facilitate accurate communication of this information between the HLS tool and the formal verification tool, a naming mechanism can be formalized and used with embodiments of the disclosed technology. For instance, for some embodiments of the disclosed technology, a formal specification of canonical names is used to facilitate the communication between the HLS tool and the formal verification tool. The names can be based, for instance, on the scheme that the HLS tool uses for naming various elements (e.g., synthesis intermediate format (SIF) names). Such names will change from implementation to implementation, depending on the particular HLS tool used and its tool-specific naming conventions, and need not be presented here as such canonical names for a given HLS tool and formal verification tool can be easily developed by those skilled in the art.

III.B.7. General Overall Embodiments

Any one or more of the techniques disclosed herein can be used, at least in part, to implement a technique in which microtransaction boundaries are generated in a high-level description of a circuit design and in the corresponding RTL of the circuit design resulting from high-level synthesis. This process of identifying and forming microtransactions can be generally referred to as loop induction. Loop induction according to the disclosed technology involves the generation of transactional boundaries in the high-level description and/or the RTL description and can use any or more of: wait insertion, loop flattening, selective RTL stalling, delay insertion to compensate for pipeline drain, and/or probe insertion and probe map generation as described above and in Section IV below.

Figure 23:
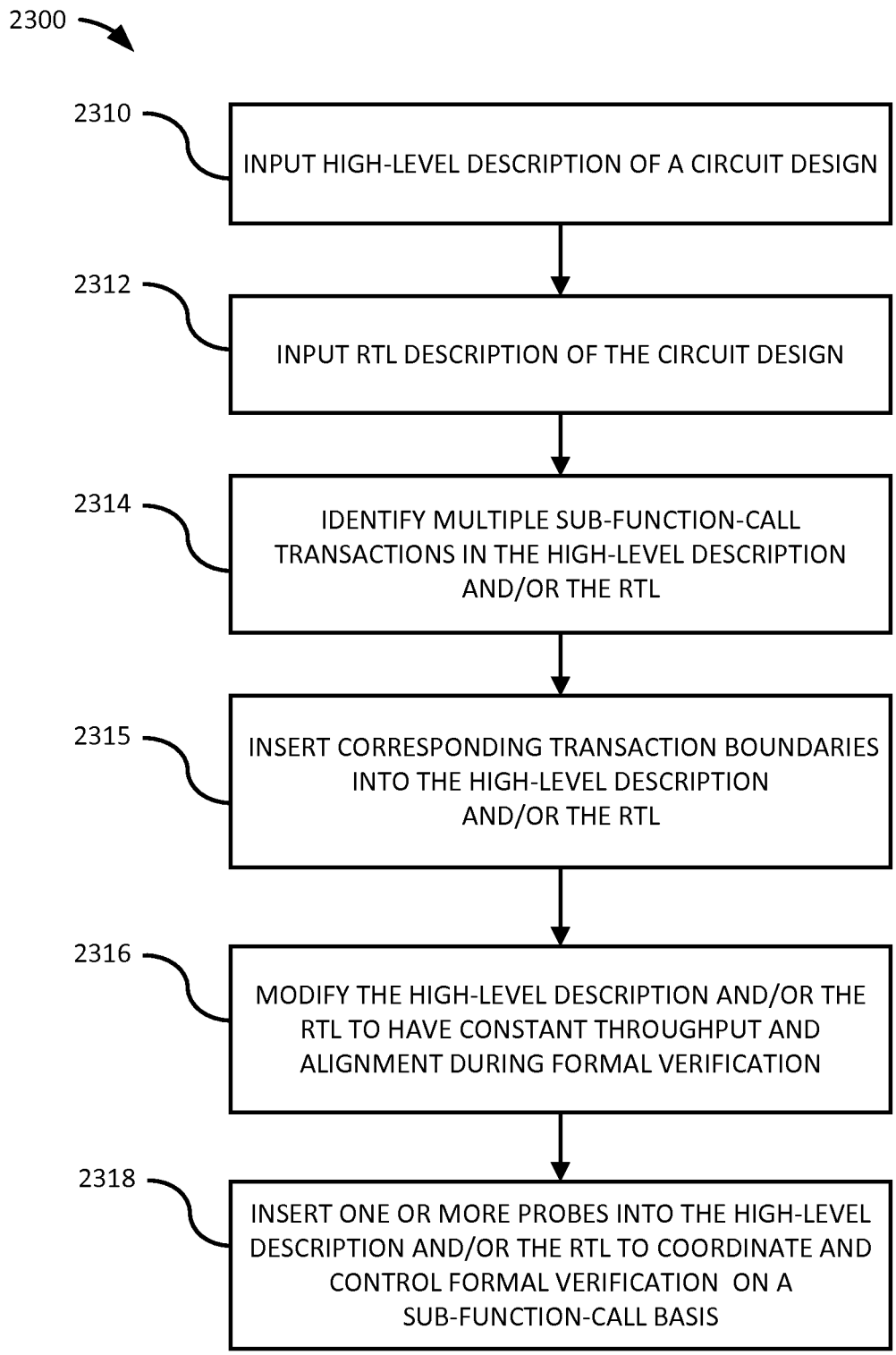
FIG. 23 is a flow chart showing a generalized example embodiment for performing loop induction.

FIG. 23 is a flow chart 2300 showing a generalized example embodiment for performing loop induction. The loop induction process can be used to prepare a high-level description and its corresponding RTL description (generated from HLS) for equivalence checking by a formal verification tool. The particular operations or sequence should not be construed as limiting, as they can be performed alone or in any combination or subcombination with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 23 can be performed, for example, by one or more specialized electronic design automation (EDA) tools that are adapted to perform and/or support high-level-synthesis formal verification. Such tool(s) can be used, for instance, as part of a circuit design and/or manufacturing process and be implemented by one or more computing devices as described above. The example embodiments described with respect to or related to FIG. 23 can be used to realize any one or more of the benefits disclosed herein (e.g., scalable verification of practical designs, reduced verification time, reduced computational complexity and overhead, reduced hardware resource usage (such as reduced memory usage), and/or other such improvements to the functioning of a computing system).

At 2310, a high-level description of a circuit design is input (e.g., buffered into memory and/or otherwise prepared for further processing). The high-level description can be a C, C++ or SystemC description of the circuit design.

At 2312, a register-transfer-level (RTL) description of the circuit design is input (e.g., buffered into memory and/or otherwise prepared for further processing), the RTL description having been synthesized from the high-level description.

At 2314, multiple sub-function-call transactions (microtransactions) are identified (e.g., in the RTL, in the high-level description, and/or in an intermediate format produced during HLS) and, at 2315, corresponding transaction boundaries are inserted into the high-level description of the circuit design and into the corresponding RTL. In some instances (e.g., for pipelined loops that are not within a pipelined loop), the transaction boundaries correspond to transitions between loop join nodes of the high-level description (e.g., the loop join nodes from a corresponding graph (such as a control flow graph (CFG) or control data flow graph (CDFG)) of the high-level description). For instance, and with reference to graph 1510 shown in FIG. 15, the transactions can be identified during the HLS process and correspond to the code portions executed between a loop join to loop join transition—namely, code portions "A", "B", "C", "D", and "E". In other instances (e.g., for pipelined loops that are within a pipelined loop), the transaction boundaries can be at the end of each iteration of a pipelined loop but not at (a) the transition before the start of the first iteration of the pipelined loop, and/or (b) the transition at the end of the last iteration of the pipelined loop. For example, for a pipelined loop within a pipelined loop, a transaction boundary can be inserted at the end of an iteration of the pipelined loop but not at other transitions of the loop. To implement the transaction boundaries, wait statements (or other such statements that create a control point for use with a formal verification tool) are inserted into the high-level description and/or into the corresponding RTL resulting from HLS at locations corresponding to the transactional boundaries.

Further, certain formal verification tools have a requirement that the throughput of each transaction be constant. In the absence of a consistent, constant throughput on either the high-level-description side or the RTL side, the transactions being verified during formal verification can become misaligned.

At 2316, one or both of the high-level description or RTL description are modified so that the transactions within the descriptions have constant throughput and are aligned during formal verification. The modifications performed can comprise one or more of the following techniques, as disclosed herein: selective stalling of the RTL (e.g., by transactor insertion into the RTL), inserting delay to compensate for pipeline drain, and/or wait balancing.

At 2318, one or more probes are inserted into one or both of the high-level description or the RTL description. For example, one or more of the following can be performed: (a) insertion into the RTL description of at least one data probe configured to indicate state data of variables and/or persistent variables in the high-level circuit design at a respective one of the transactional boundaries; or (b) insertion of at least one control probe configured to indicate when a loop in the RTL description is being executed. Corresponding probe maps can also be generated. The probes inserted at 2318 are designed to facilitate sub-function-call-level formal verification by providing control points indicating the execution status of the high-level description and the RTL during verification and data points that are used to coordinate the transfer of state data between each transaction.

Each of method acts 2315, 2316, 2318 results in a transformation of one or both of the high-level description or the RTL description designed to facilitate formal verification on a microtransaction basis. After performance of any of the method acts shown in FIG. 23, the transformed versions of the high-level description and/or the corresponding RTL description can be stored. After completion of the desired transformations, the resulting versions of the high-level description and/or the corresponding RTL description can be formally verified by a formal verification tool on a microtransaction basis. During formal verification of the modified versions of the high-level description and the RTL description, the probe maps are used to produce the values used during equivalence checking and to control the advancement of the equivalence checking across the transactions. It should be noted that any of the operations described with respect to FIG. 23 or anywhere in this disclosure can be performed by the formal verification tool, the HLS tool, or by an intermediate tool used to facilitate the formal verification process.

Figure 24:
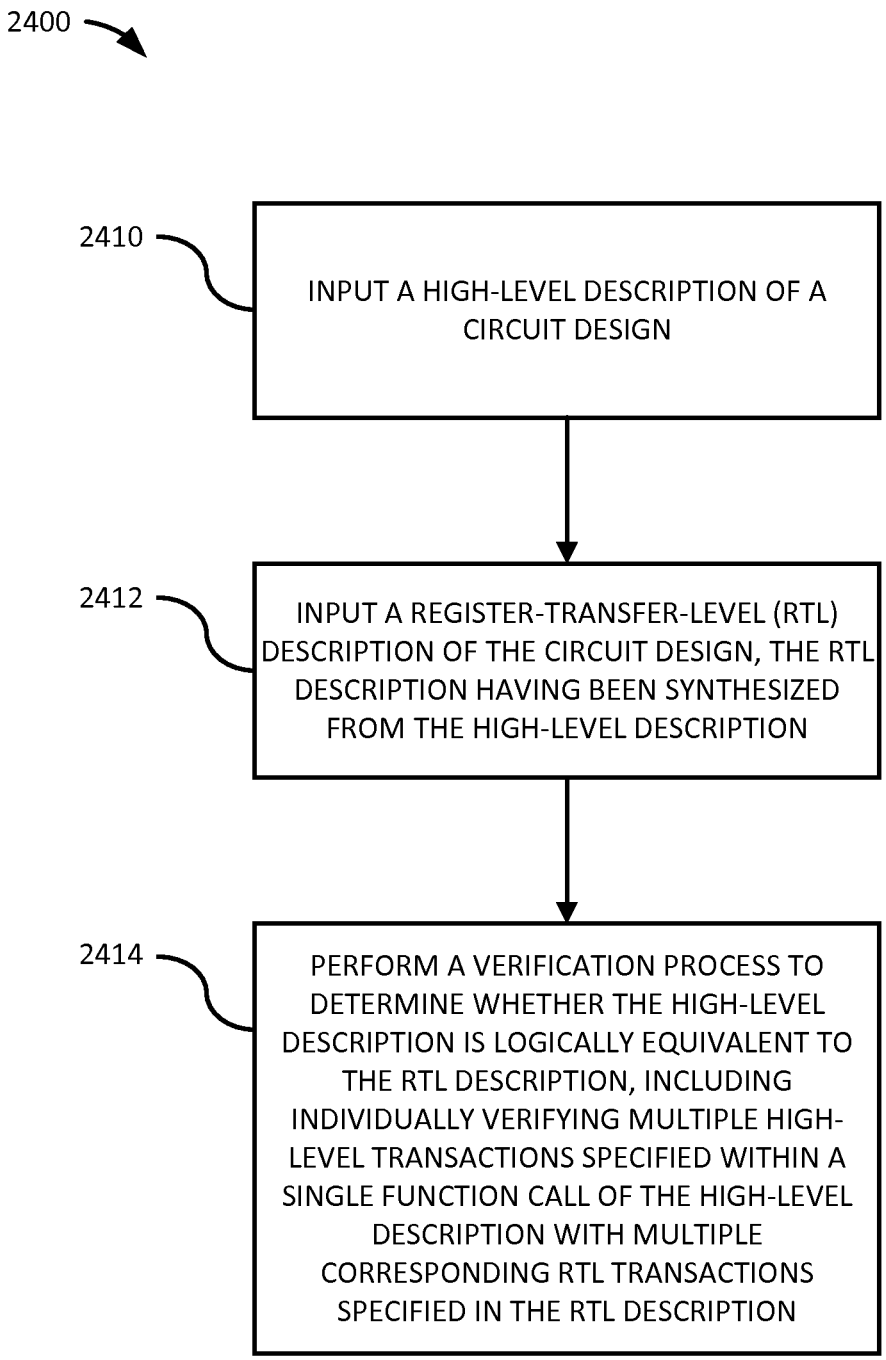
FIG. 24 is a flow chart showing a generalized example embodiment for implementing a formal verification technique according to the disclosed technology.

FIG. 24 is a flow chart 2400 showing a generalized example embodiment for implementing such a formal verification technique. The particular operations or sequence should not be construed as limiting, as they can be performed alone or in any combination or subcombination with one another. Additionally, the illustrated operations can be performed together with one or more other operations. Still further, the identified operations need not be performed by a single software module, but can be implemented using multiple modules or software tools, which collectively perform the illustrated method. The example embodiment of FIG. 24 can be performed by one or more specialized electronic design automation (EDA) tools that are adapted to perform and/or support high-level-synthesis formal verification. Such tool(s) can be used, for instance, as part of a circuit design and/or manufacturing process and be implemented by one or more computing devices as described above. The example embodiments described with respect to or related to FIG. 24 can be used to realize any one or more of the benefits disclosed herein (e.g., scalable verification of practical designs, reduced verification time, reduced computational complexity and overhead, reduced hardware resource usage (such as reduced memory usage), and/or other such improvements to the functioning of a computing system).

At 2410, a high-level description of a circuit design is input (e.g., buffered into memory and/or otherwise prepared for further processing). The high-level description can be a C, C++, or SystemC description of the circuit design.

At 2412, a register-transfer-level (RTL) description of the circuit design is input (e.g., buffered into memory and/or otherwise prepared for further processing), the RTL description having been synthesized from the high-level description.

At 2414, a verification process is performed (e.g., by a logic equivalence checking tool) to determine whether the high-level description is logically equivalent to the RTL description. In the illustrated embodiment, the verifying comprises individually verifying multiple high-level transactions specified within a single function call of the high-level description with multiple corresponding RTL transactions specified in the RTL description, thereby verifying the RTL description at a level of granularity smaller than the function-call level.

As discussed, one or more transaction boundaries can be inserted within the single function call, thereby creating the multiple high-level transactions specified within the signal function used during the verifying. For instance, the transaction boundaries can be wait statements. The RTL description can include one or more pipelined loops that remain pipelined and are not unrolled during the verifying. Each iteration of the one or more pipelined loops can be treated as a separate transaction during the verifying. The verifying can be performed by selectively stalling execution of one or more of the corresponding RTL transactions so that the corresponding RTL transactions are aligned with the high-level transactions during the verifying. The method can further comprise selectively inserting one or more statements that create delay into the high-level description. For instance, the selectively inserting the one or more delay statements can be performed so that the verifying of the multiple high-level transactions specified within the single function call with the multiple corresponding RTL transactions specified in the RTL description (including pipelined operations in the RTL) is completed before high-level transactions and RTL transactions from a different function call are verified. In some embodiments, the method can further comprise inputting one or more optimization hints provided by an HLS tool that synthesized the high-level description, where the optimization hints describe one or more optimizations performed by the HLS tool. In such embodiments, the verifying can comprise formally verifying the optimizations performed by the HLS tool using the optimization hints.

Figure 25:
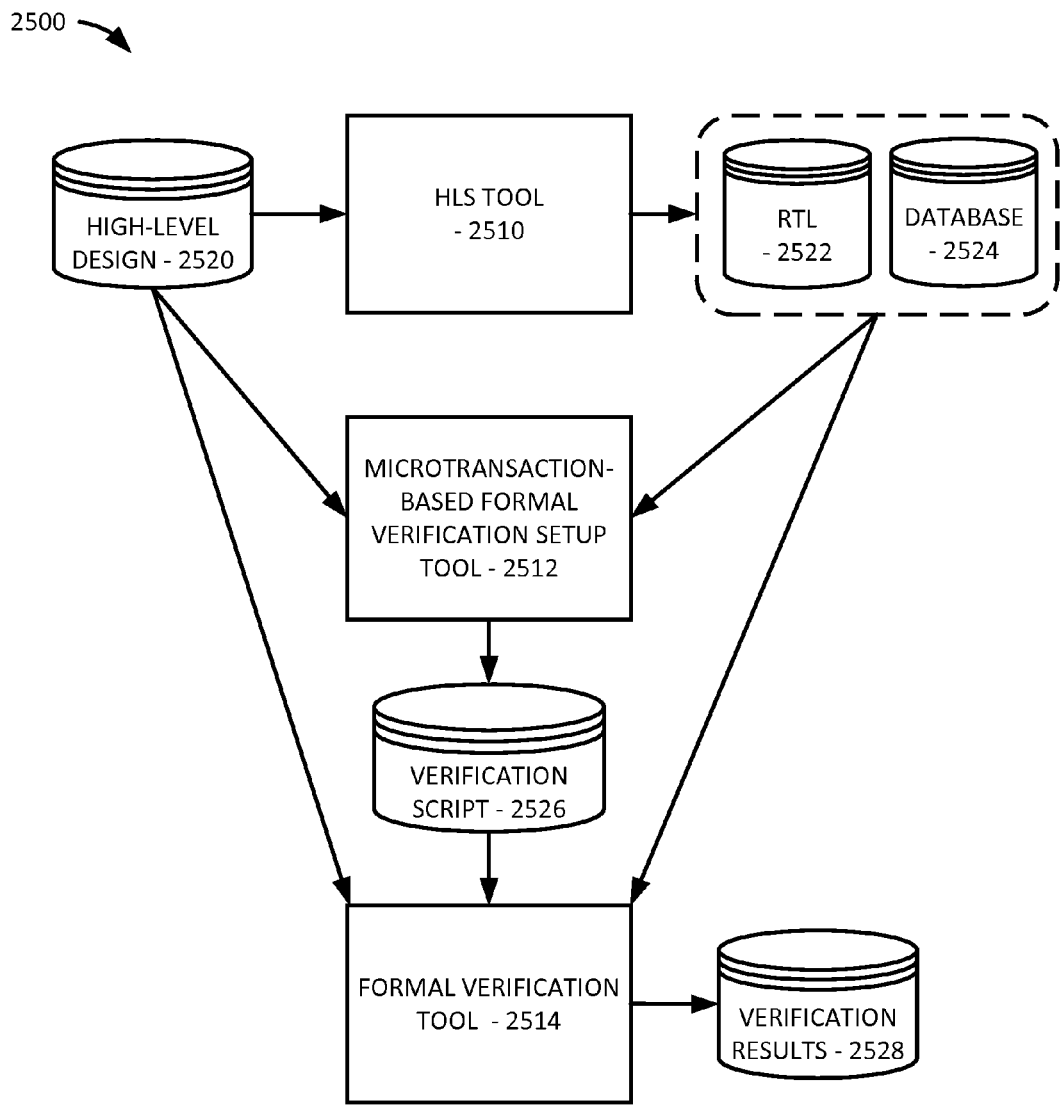
FIG. 25 is a block diagram showing a generalized example embodiment of the components used during a microtransaction-based formal verification process according to certain embodiments of the disclosed technology.

FIG. 25 is a block diagram 2500 showing a generalized example embodiment of the components used during a microtransaction-based formal verification process according to certain implementations of the disclosed technology. The particular components shown can be used with one or more other components. Still further, the identified software components are shown as being separate in FIG. 25 (e.g., as part of a software suite), but need not be. For example, the formal verification setup tool can be incorporated into one or more of the formal verification tool or the HLS tool and used to support the formal verification process as disclosed herein. Still further, all the tools can be incorporated into a single tool, if desired.

FIG. 25 illustrates an HLS tool 2510 configured to receive (input) a high-level description 2520 (e.g., a C, C++, or SystemC circuit description) and synthesize it into an RTL description 2522 (e.g., a VHDL, Verilog, or SystemVerilog RTL description). In the illustrated embodiment, the HLS tool 2510 also generates a database 2524 storing information about the HLS process (e.g., HLS as performed according to embodiments of the disclosed technology). As more fully discussed below, the database 2524 includes data that can be used to aid the formal verification process. Any suitable HLS tool can be used, but in one example is the Catapult high level synthesis tool.

As discussed, once high level synthesis has occurred, it is desirable to formally verify the results to ensure the logical equivalence of the resulting RTL to the original high-level design. To setup and thereby support the formal verification problem using a microtransaction-based approach as described herein, a microtransaction-based formal verification setup tool 2512 can be used. This tool 2512 can be a stand-alone software module or can be at least partially incorporated into any of the HLS tool 2510 or the formal verification tool 2514. In the illustrated embodiment, the microtransaction-based formal verification setup tool 2512 is configured to produce a verification script 2526 that is adapted for the formal verification tool 2514 and that causes verification to proceed according to embodiments of the disclosed technology. In general, the verification script 2526 comprises information that allows the formal verification tool 2514 to setup and properly conduct the formal verification process using sub-function-call transactions (microtransactions). Further, the formal verification tool 2514 can use information from the database 2524 during the formal verification process. The illustrated database 2524 is produced during high-level synthesis, such as by HLS tool 2510. Furthermore, the database 2524 can include information that is specifically adapted for microtransaction-based formal verification.

In certain embodiments of the disclosed technology, for example, the database 2524 comprises one or more of: (1) loop handling information; (2) optimization hints; (3) timing information for the RTL; (4) commands to insert wait statements; and/or (5) probe and probe map information.

The loop handling information in the database 2524 can comprise, for example, information generated by the HLS tool that describes how each loop in the design was handled during synthesis. This loop handling information may have originally been provided to the HLS tool by the user as a synthesis directive. The microtransaction-based formal verification setup tool 2512 can analyze this information, along with the high-level description 2520 itself, to develop loop handling information in the verification script 2526. The loop handling information in the verification script 2526 can indicate, for example, the identification of the loop and an identification of whether the loop is to be treated as flattened, unrolled, partially unrolled, scheduled, or pipelined during formal verification.

The optimization hints in the database 2524 can include data indicating what optimizations were performed during HLS so that the formal verification tool can verify whether such optimizations were suitable as part of the formal verification process. For instance, the optimization hint may comprise data indicating that the HLS tool experienced a conditional statement (e.g., an IF ELSE statement) where only one branch was ever functional, thus allowing the HLS tool to remove the unused branch. The optimization hints may also comprise data indicating the range of values experienced by a variable, thus permitting the HLS tool to optimize away certain unnecessary hardware for the variable. The microtransaction-based formal verification setup tool 2512 can pass this information on to the formal verification tool 2514 with appropriate translations adapted for the tool, if necessary. The formal verification tool 2514 can, in turn, formally verify these optimization hints in order to determine whether such optimizations were appropriate. In other words, the formal verification tool 2514 does not necessarily adopt the optimizations performed by the HLS tool "at faith" but instead can also formally verify the optimizations described by the optimization hints. In particular implementations, the optimization hints are treated as inductive invariants used by the formal verification tool for effective verification.

The timing information for the RTL in the database 2524 can comprise data indicating the latency of probe maps, the throughput for various portions of the design as well as for the overall design, and/or other such timing information. For instance, this information may indicate the throughput for code portions (e.g., as shown as "TP" in FIG. 16) as well as the initiation interval for pipelined loops (e.g., as shown as "II" in FIG. 16). The microtransaction-based formal verification setup tool 2512 can pass this information on to the formal verification tool 2514 with appropriate translations adapted for the tool, if necessary.

The commands to insert wait statements in the database 2524 may be created by the HLS tool and included in the database for certain situations where the HLS tool recognizes certain code portions as being distinct from others and recommends that a wait be inserted at the end of the code portion. Further, in some cases, the commands may be generated when the top loop of a function with an internal loop is not pipelined. For example, the HLS tool may generate such commands for wait statements when the top loop of a function is not pipelined and there exist distinct code portion in the code being the synthesized. In FIG. 17, for instance, the wait statements 1730, 1732, 1734, may be generated by the formal verification tool 2514 itself as it processes the high-level design 2520 and performs wait insertion, or may be generated as a result of commands to insert wait statement generated by the HLS tool 2510 (or, in some embodiments, by the microtransaction-based formal verification setup tool 2512) after the tool processes the high-level design 2520 and performs a wait insertion process.

The probe and probe map information in the database 2524 can comprise, for example, a data probe map and a control probe map as well as other data indicating what probes were created during the probe generation process. In the illustrated implementation, the HLS tool 2510 performs the probe and probe map generation process and inserts the control probes and data probes into the RTL 2522. Further, in the illustrated embodiment, the formal verification tool 2514 uses the probe maps to insert control probes into the high-level design 2520, thus allowing for control and transaction alignment of the high-level design 2520 with the RTL 2522 during formal verification.

Using the database 2524 and the verification script 2526, the formal verification tool 2514 can perform formal verification of the RTL 2522 relative to the high-level design 2520. In particular implementations, the formal verification tool 2514 will modify the high-level design 2520 as part of the formal verification process. For instance, the formal verification tool 2514 can insert control probes into the high-level design 2520 to provide correspondence with those control probes inserted into the RTL 2522. Further, the formal verification tool 2514 can itself perform any of the techniques described herein (e.g., wait insertion, loop flattening, selective RTL stalling, delay insertion to compensate for pipeline drain techniques, and the like) to enable microtransaction-based formal verification. For example, the formal verification tool 2514 can use the loop information provided in the database 2524 to determine how a loop should be handled according to a microtransaction-based verification approach.

Once formal verification is performed, the formal verification tool 2514 provides verification results 2528. The verification results 2528 can be a log file that informs the user of the equivalence. The verification results 2528 can also be presented to the user via user interface on a display device. If the designs are determined to be not equivalent, the verification results 2528 can provide a falsification or counter example (e.g., what values have been provided to the design that produce the false result). The verification results 2528 can, in some cases, also include a waveform for the falsification and/or test benches for reproducing the false result so that a designer can debug the design and alter the RTL or the high-level design as appropriate.

III.B.8. Experimental Results

This section presents experimental results for a formal verification tool implementing an example embodiment of the microtransaction-based techniques disclosed herein. In particular, Table 1 below shows results from a formal verification tool implementing an embodiment of the loop flattening, selective RTL stalling, delay insertion, and probe insertion techniques disclosed herein. The runtime and memory usage benefits that are illustrated in Table 1 for the example embodiment can also be realized, at least in part, by using any combination or subcombination of the disclosed techniques.

In Table 1, the first column identifies the design (a C++ design) that was synthesized using an HLS synthesis tool. Several designs were tested, including designs for video applications (e.g., video processing), image applications (e.g., image processing), and communication applications (e.g., communication processing). The second column indicates an area estimate for the designs based on the number of gates used to implement the design. The third column indicates the number of loops as well as the number of iterations of the loops in the designs (the cumulative number of iterations, accounting for nested loops). As can be seen, the various designs included varying numbers of loops in the designs, with various numbers of iterations of the loops. As explained above, the microtransaction techniques disclosed herein enable fast, computationally efficient, and memory efficient formal verification for designs that have deep loops (e.g., loops with 100 or more iterations, cumulatively). The fourth column shows runtime and memory usage results for the designs from an example HLS tool (here, Catapult) used to perform HLS and to prepare the high-level description and synthesized RTL description for microtransaction-based formal verification. The runtime is given in seconds, whereas the memory is given in megabytes (MB) used during HLS. The fifth column shows runtime and memory usage for the designs for the example embodiment of the microtransaction-based verification tool. Again, the runtime is given in seconds, whereas the memory is given in megabytes (MB) used during formal verification. The sixth column shows the behavior of a conventional, non-microtransaction-based formal verification tool for the designs. The behavior described is sixth column is expected behavior based on first-hand experience with such a non-microtransaction-based tool.

As can be seen in the sixth column, with the conventional formal verification tool that does not use microtransaction-based verification, it is not even possible to perform formal verification for many of the designs having loops with loop iterations. For instance, for designs having a relatively large number of loop iterations (e.g., 100 or more, cumulative), the memory requirements are too great to perform formal verification using a non-microtransaction-based formal verification approach. By contrast, such designs can be formally verified using embodiments of the disclosed microtransaction-based formal verification tool. Further, for designs with a relatively large number of gates (e.g., 200,000 gates or more), such as "Comm1", a conventional formal verification tool times out before the formal verification process is complete. By contrast, such large designs can be handled and verified using the microtransaction-based formal verification tool. Further, even for designs with fewer numbers of loops and iterations (such as "Video2" with 2 loops and 48 iterations, "Image3" with 1 loop and 64 iterations, "Comm3" with 1 loop and 12 iterations), the runtime decrease using the microtransaction-based technique is significant and can often be orders of magnitude faster than conventional techniques. This runtime savings can be significant in the design cycle where multiple design iterations may be need to finalize a circuit design and where deadlines to complete the design can be project critical.

TABLE 1

| Design | Area Estimate | Loops and # Iterations | HLS Tool Runtime/ Memory | Microtransaction-Based Verification Tool Runtime/ Memory | Behavior of Conventional Verification Tool w/o Microtrans. |
|---|---|---|---|---|---|
| Video1 | 6888 | 0 | 418/491 | 1691/189 | Similar |
| Video2 | 15553 | 2/48 | 600/294 | 98/242 | 10× slower |
| Video3 | 2296 | 2/1.4M | 205/291 | 58/181 | Out of memory |
| Video4 | 9366 | 2/307K | 350/312 | 736/842 | Out of memory |
| Video5 | 2107 | 2/524K | 1100/1024 | 1864/318 | Out of memory |
| Video6 | 4944 | 2/1.4M | 205/288 | 85/182 | Out of memory |
| Video7 | 19300 | 2/4M | 300/523 | 14553/2314 | Out of memory |
| Video8 | 2728 | 3/368K | 1200/357 | 6387/466 | Out of memory |
| Image1 | 173823 | 2/307K | 240/304 | 674/249 | Out of memory |
| Image2 | 45910 | 0 | 500/273 | 374/249 | Similar |
| Image3 | 114223 | 1/64 | 1100/375 | 3296/429 | 30× slower |
| Image4 | 186378 | 2/307K | 250/300 | 698/251 | Out of memory |
| Comm1 | 217067 | 0 | 740/340 | 2581/922 | Timeout |
| Comm2 | 12813 | 0 | 600/775 | 264/214 | Similar |
| Communication3 | 8857 | 1/12 | 1200/466 | 4314/1301 | 4× slower |

IV. Further Example Implementations and Implementation Considerations

The subsections below provide further details, considerations, and alternatives to the techniques introduced and discussed above. Any one or more of the disclosed features, aspects, techniques, and/or tools can be used together with or in replacement of any of the features, aspects, techniques, and/or tools discussed above. Furthermore, the particular operations or sequences discussed below should not be construed as limiting, as they can be performed alone, in different sequences, or in any combination or subcombination with one another. Additionally, the illustrated operations can be performed together with one or more other operations. Still further, the identified operations need not be performed by a single software module, but can be implemented using multiple modules or software tools, which collectively perform the illustrated method.

IV.A Drain Verification

Figure 26:
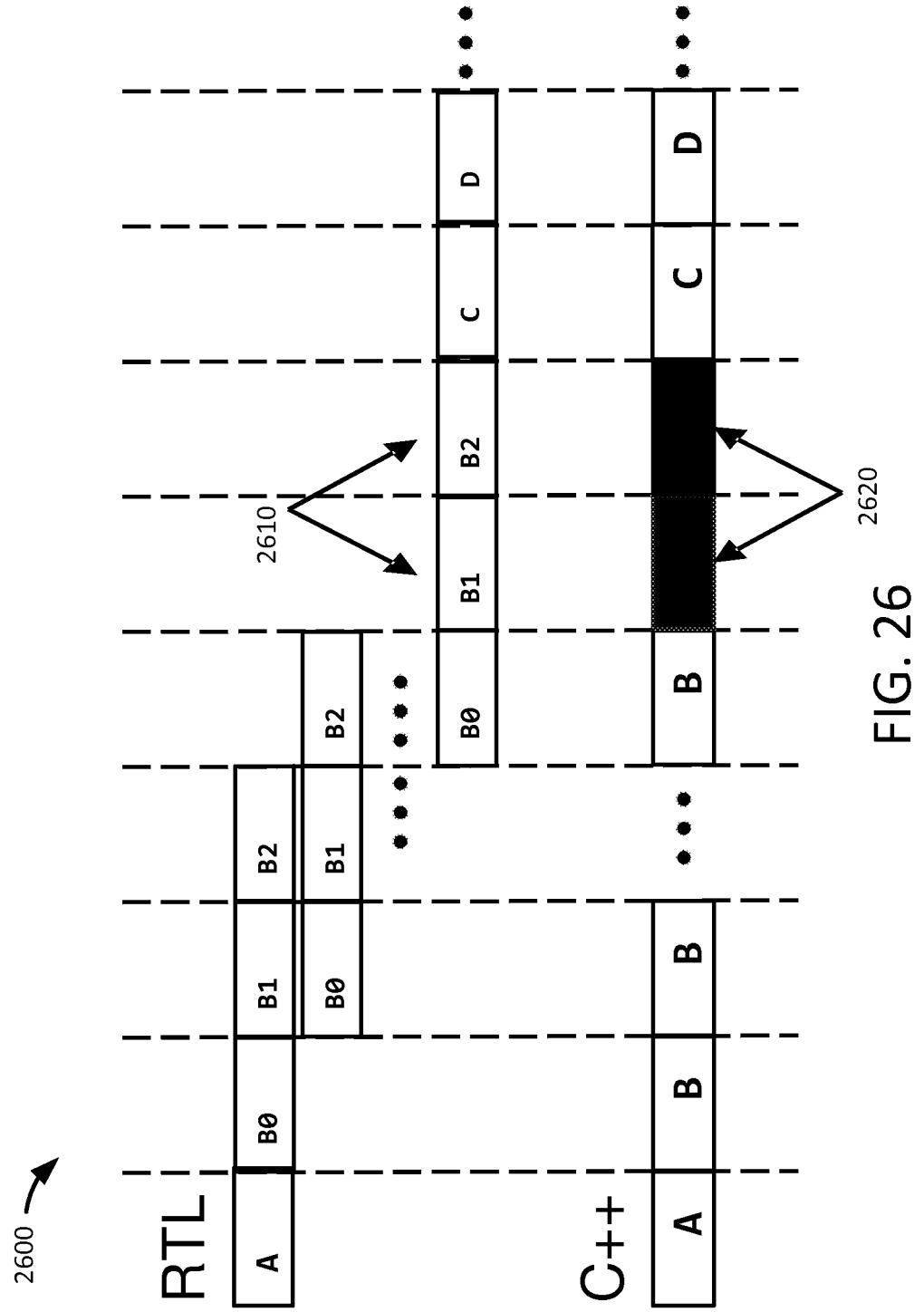
FIG. 26 is a schematic block diagram illustrating pipeline drain cycles and delay insertion according to embodiments of the disclosed technology.

According to certain embodiments of the disclosed technology, when a loop is pipelined, the resultant RTL has a number of cycles in the final iteration of the loop where it completes computation and flushes data out of the loop. This period is called pipeline drain and the number of drain cycles is determined by Formula (1) above (ceil$\{(D-II) \div II\}$), where II is the initiation depth and D is the number of pipeline stages. Since the original source executes in a single clock cycle and is not pipelined, it finishes execution of the loop before the RTL. FIG. 26 is a schematic block diagram 2600 in which cycles 2610 illustrate the pipeline drain cycles for RTL with three pipeline stages for a loop "B". In order to enable the inductive verification of such pipelined loops, certain embodiments of the disclosed technology employ special treatment of these pipeline drain cycles so they are treated as "microtransactions" of their own. Two example methods to create such microtransactions for pipelined drain are described below IV.A.1. Drain with Stall Verification Consider the example in FIG. 17. The while(1) loop has been pipelined with an II of 1 by the HLS tool and the resultant RTL has 3 pipeline stages. Thus, by the formula above, the number of drain cycles is 2. In order to "slow" the original source code (e.g., the C++ source) during formal verification to match the timing of the RTL, extra wait statements 1740, 1742 are added. These wait statements stall the source and each wait statement acts as a microtransaction of its own. FIG. 26 shows the resultant verification setup from a timing perspective.

IV.A.2. Drain with Freeze Verification

An alternative to adding waits and stalling the original source code is to freeze the computation. This approach can be implemented much like the way the RTL freezing is accomplished; the design is clock-gated until the computation is ready to begin again. Consider the example in the code below in Table 2:

TABLE 2

```
int dut (ac_channel<int> x, int y)
{
A; // 1 C-Step (TP_new = 2)
int i = ( );
wait ( ); //wait insertion
    while (1){ // pipe, II-1 (TP_new =2)
    B; // 3 C-Steps
    i++;
    if (! (i<1000)) break;
    wait ( ); //wait insertion
    }
wait ( ); //wait insertion - freeze
C; // 2 C-Steps
}
```

The verification tool can freeze the design when the wait( ) statement commented with "wait insertion—freeze" is executed. The freeze would last for the number of cycles indicated by the formula above. Thus the original source code is slowed down to match the timing of the RTL. The resulting timing is also as shown in FIG. 28. Note that in this case, unlike in the "drain with stall verification" approach, there is no need for extra drain waits as the freezing introduces the extra transactions.

IV.B Further Probe, Transaction Boundary, and Loop Flattening Examples and Considerations This section describes further example processes for generating one or more probes, for inserting transaction boundaries, and for performing loop flattening in accordance with particular implementations of the disclosed technology. For instance, the information below specifies example probes, transaction boundaries, and loop flattening procedures for designs with transaction-level interfaces (e.g., C++ and SystemC descriptions of circuit designs). Further, the transactions can be sub-function-call-level transactions (microtransactions) as disclosed herein. In the discussion below, the term "select" refers to a branching statement that can enclose a scope. This covers, for example, "if", "switch", "logical and (&&)" statements, and "logical or (||)" statements. "Break" and "Continue" statements are not covered in this particular implementation, and a "return" statement is considered to be a special case of a "break" statement. Further, the discussion below refers generally to an HLS tool, which can be any suitable HLS tool, such as the Catapult high level synthesis tool available from Calypto Design Systems.

IV.B.1. Example Probe Types and Probe Creation

This subsection describes example probe embodiments and techniques for adding probes during HLS. This section refers to two kinds of probes—control probes and data probes—any one or more of which can be used in embodiments of the disclosed technology. According to one exemplary embodiment, one or more of these probes are added to the high-level description (e.g., by the verification tool and/or by the HLS synthesis tool) according to any one or more of the rules described below. Then, because there may be some redundancies among the probes or because some probes may be unnecessary or unhelpful, a probe removal process can be performed according to one or more of the probe removal rules described below. Further, one or more of these probes can be removed based on constraints and/or when HLS tool optimizations duplicate probes. This process of generating probes and removing redundant probes may occur in separate passes through the high-level description, or, in some instances, may be performed as part of a single process. Further, the rules described below should not be construed as limiting, as other probe insertion rules (e.g., more complex probe insertion that a priori account for probe redundancies) can be devised and used without departing from the scope of the disclosed technology.

IV.B.1.a. Control Probes.

Control probes are used to capture the control state of the design and help align the state machine between the source and the RTL. These probes do not attach to a variable; instead, they are associated with a loop or an "if" statement. Control probes are typically added to both the high-level description as well as the RTL description. Further, control probes can take the form of signal that toggles when the corresponding line in the high-level description is executed. For example, a control probe can produce a signal that transitions from 0 to 1 (or vice versa) when the corresponding high-level description or RTL line is executed during the formal verification process.

In one particular implementation, the following rules are used to insert control probes:

C1) A control probe is added before every loop except the main loop;

C2) A control probe is added at the start of every loop;

C3) A control probe is added after every loop except the main loop; and

C4) A control probe is added at the start of each branch of a select if the current branch does not contain a loop, but a different branch does contain a loop. An else branch will be added to any select that doesn't cover all conditions so this probe can be added. A select with a break in one branch and a loop after the break, but still in the same loop, is considered to have a loop in branches without the break.

These rules should not be viewed as limiting, however, as any one or more of the rules can be used alone, in combination with one another, or in combination with one or more other rules. In the example below, Control Probes are labelled as "C1", "C2", "C3" or "C4" to show which rule above was used to trigger adding the probe.

IV.B.1.b Data Probes.

Data probes are associated with a variable at a point in time in the high-level description (e.g., the C++ description). A data probe is typically inserted only into the RTL, however, the verification tool can insert the data probes into the high-level description as well, if required to map the values of the high-level description. Further, a data probe can include a flip flop as well as combinational logic that is adapted to perform a combinational function described by the high-level description. The combinational logic reconstructs the value which is probed in terms design signal and allows the state value captured by the probe to correspond to the state value described by the high-level design. For one example HLS tool (here, Catapult), data probes can be added explicitly by calling ac::probe ("probe_name", expression).

A special class of data probes for static variables or the global variables in the C++/System C description is called static probes, or persistent data probes (PDPs). More specifically, data probes are also generated on the variables that are declared persistent in the high-level description of the circuit design, either by declaring them static in the high-level description language (e.g., as in C++) or by declaring them outside the main loop in the high-level description language (e.g., as in SystemC). These probes are added at the start of the main loop. In the example below, persistent Data Probes are tagged with "PDP".

In one particular embodiment, the following rules are used to add data probes during compile (note that the numbering is sparse to align the Data probes with the Control Probe numbers). In general, a data probe is used for a variable at a microtransaction boundary if the variable holds state across the boundary. With that in mind, a static data probe holds state across multiple invocations of the top level DUT function, or across the virtual while(1) loop that executes the DUT function infinitely often.

P0) Static data probes (PDPs) are added at the beginning of the main loop. These are added at the locations described below as well;

P1) A data probe is added before any "select" containing a loop or before any select containing a break or continue statement if there is a loop after the select in the enclosing loop;

P2) A data probe is added at the start of every loop in the design;

P3) A data probe is added after every loop except the main loop; and

P4) A data probe is added at the start of each branch of a select if the current branch does not contain a loop, but a different branch does contain a loop. An else branch will be added to any select that doesn't cover all conditions so this probe can be added.

These rules should not be viewed as limiting, as any one or more of the rules can be used alone, in combination with one another, or in combination with one or more other rules. In the example below, data probes are labeled as "P1", "P2", P3" and "P4" to show which rule above was used to trigger adding the probe.

In certain embodiments, control probes are added to both the RTL and high-level description of the circuit design. In some embodiments, whereas data probes are typically added only to the resulting RTL design (note though that the data probes may be added to an intermediate format of the high-level description for purposes of guiding the HLS synthesis process). Also note that in order to map the data probes, one should capture the condition to indicate that a microtransaction boundary is being crossed. This is achieved by mapping the data probes with a valid condition. For a flattened loop, this implies that the data probes for the loop should not be mapped during the first iteration of the loop. This is achieved by creating a valid condition that is a conjunction of the loop valid control probe, and the negation of the loop init control probe.

IV.B.1.d. Example

The code in Table 3 below shows an example of where probes are added in accordance with the example rules outlined above:

TABLE 3

```
main_loop {
  PDP_for_statics ( );
  C2_main_loop ( );
```

TABLE 3-continued

```
  P2_main_loop ( );
  C1_pre_A_loop ( );
  A_loop {
    C2_A_loop ( );
    P2_A_loop ( );
    if ( ) break;
  }
  C3_post_A_loop ( ):
  P3_post_A_loop ( );
  P1_pre_if _B_loop ( );
  if ( ) {
    C1_pre_B _loop ( );
    B_loop {
      C2_B_loop ( );
      P2_B_loop ( );
      P1_pre_break_C_loop ( );
      if ( ) {
        C4_pre_break_C_loop ( );
        break;
      }
      C1_pre_C_loop ( );
      C_loop {
        C2_C_loop ( );
        P2_C_loop ( );
      }
      C3_post_C_loop ( );
      P3_post_C_loop ( );
    }
    C3_post_B_loop ( );
    P3_after_B_loop ( );
    C1_pre_D_loop ( );
    D_loop {
      C2_D_loop ( );
      P2_D_loop ( );
    }
    C3_post_D_loop ( );
    P3_after_D_loop ( );
    C1_pre_E_loop ( );
    E_loop {
      C2_E_loop ( );
      P2_E_loop ( );
    }
    C3_post_E_loop ( );
    P3_post_E_loop ( );
  } <implicit else> {
    C4_else_if_B_loop ( );
    P4_else_if_B_loop ( );
  }
}
```

IV.B.2. Probe Removal in Pipelined Designs

This section describes exemplary rules for removing probes when a region of the code is pipelined and the loop is flattened. In certain embodiments, probes after loops are removed because the last loop iteration is merged into the code after the loop (until the next loop or select containing a loop). The probe at the start of loop also becomes conditional because the first loop iteration is merged with the code before the loop (back to the previous loop or first select after the previous loop). Essentially, probes are eventually mapped to state variables, and the states are carried only across backedges or if the probe is at the beginning of the micro transaction. The probes in a loop in the first iteration are not at the beginning of the microtransaction, and hence they need not be mapped.

In one example embodiment, and as shown in the table below, probes P3 and C3 for each flattened loop are removed according to a first rule. Furthermore, in certain embodiments, this rule is applied only to the loops that are flattened. For instance, in the example introduced above, the design is pipelined at the top and the probe after loop E in pipelining loop E is not removed. Note that loop D is a straight forward loop that preceded another loop (loop E) unconditionally. Thus, the probes after loop D are removed as shown in Table 4 below:

TABLE 4

```
main_loop {
  PDP_for_statics ( );
  C2_main_loop ( );
  P2_main_loop ( ); // Back edge Only
  C1_pre_A_loop ( );
  A_loop {
    C2_A_loop ( );
    P2_A_loop ( ); // Back edge Only
    if ( ) break;
  }
  P1_pre_if_B_loop ( );
  if ( ) {
    C1_pre_B_loop ( );
    B_loop {
      C2_B_loop ( );
      P2_B_loop ( ); // Back edge Only
      P1_pre_break_C_loop ( );
      if ( ) {
        C4_pre_break_C_loop ( );
        break;
      }
      C1_pre_C_loop ( );
      C_loop {
        C2_C_loop ( );
        P2_C_loop ( ); // Back edge Only
      }
    }
    C1_pre_D_loop ( );
    D_loop {
      C2_D_loop ( );
      P2_D_loop ( ); // <<== Special case, back and
forward edge
    }
    C1_pre_E_loop ( );
    E_loop {
      C2_E_loop ( );
      P2_E_loop ( ); // <<== Special case, back and
forward edge
    }
  } <implicit else> {
    C4_else_if_B_loop ( );
    P4_else_if_B_loop ( );
  }
}
```

IV.B.3. Probe Removal for Non-Pipelined Designs

This section describes exemplary rules for removing probes for non-pipelined designs. In certain embodiments, probe removal for non-pipelined designs has simpler rules because there is no overlap of regions at the start or end of the execution of a loop.

In one particular implementation, the following rule is applied: remove probes associated with select, break, and continue.

Table 5 below shows the application of this rule to the example introduced above. As seen, C4, P1 and P4 probes are removed.

TABLE 5

```
main_loop {
  PDP_for_statics ( );
  C2_main_loop ( );
  P2_main_loop ( );
  C1_pre_A_loop ( );
  A_loop {
    C2_A_loop ( );
    P2_A_loop ( );
    if ( ) break;
  }
  C3_post_A_loop ( );
  P3_post_A_loop ( );
  if ( ) {
    C1_pre_B_loop ( );
    B_loop {
      C2_B_loop ( );
```

TABLE 5-continued

```
      P2_B_loop ( );
      if ( ) {
        break;
      }
      C1_pre_C_loop ( );
      C_loop {
        C2_C_loop ( );
        P2_C_loop ( );
      }
      C3_post_C_loop ( );
      P3_post_C_loop ( );
    }
    C3_post_B _loop ( );
    P3_after_B_loop ( );
    C1_pre_D_loop ( );
    D_loop {
      C2_D_loop ( );
      P2_D_loop ( );
    }
    C3_post_D_loop ( );
    P3_after_D_loop;
    C1_pre_E _loop ( );
    E_loop {
      C2_E_loop ( );
      P2_E_loop ( );
    }
    C3_post_E _loop ( );
    P3_post_E_loop ( );
  } <implicit else> {
  }
}
```

IV.B.4. Example Rules for Probe Transformations During Optimization

When the HLS tool (or other tool used to setup formal verification) performs loop transformations, it is possible for probes to be deleted or copied. Therefore, in certain example embodiments, the HLS tool (or other tool used to setup formal verification) is adapted to follow one or more of the following rules:

Rule (1): If a loop is completely unrolled or determined to have only one loop iteration, then probes associated with the loop are removed. For the example introduced above, this rule results in probes C1, C2, C3, P2, and P3 being removed.

Rule (2): After a loop is removed, the tool re-inspects the design and checks for C4, P1 and P4 probes on the select that contained the loop; if a select no longer has a loop inside (or break no longer has a loop after), then C4, P1 and P4 for that condition are removed. For example, if the C_loop from the example introduced above is unrolled, this rule will result in the following modifications shown in Table 6 below:

TABLE 6

```
C1_pre_B_loop ( );
B_loop {
  C2_B_loop ( );
  P2_B_loop ( );
  if ( ) {
    break;
  }
  C_loop { } ⇐
Unrolled
}
```

Rule (3): If a loop is partially unrolled, the body of the loop is copied and the duplicate C2 and P2 probes are deleted. Optimization may then determine that if/loop structures are not needed and remove them. For example, if the B_loop from the example introduced above is unrolled by 2, then application of this rule will result in the following modifications shown in Table 7 below:

TABLE 7

```
C1_pre_B_loop ( );
B_loop {
    C2_B_loop ( );
    P2_B_loop ( );
    P1_pre_break_C_loop ( );
    if ( ) {
        C4_pre_break_C_loop ( );
        break;
    }
    C1_pre_C_loop ( );
    C_loop {
        C2_C_loop ( );
        P2_C_loop ( );
    }
    C3_post_C_loop ( );
    P3_post_C_loop ( );
    P1_pre_break_C_loop#1 ( );
    if ( ) {
        C4_pre_break_C_loop#1 ( );
        break;
    }
    C1_pre_C_loop#1 ( );
    C_loop {
        C2_C_loop#1 ( );
        P2_C_loop#1 ( );
    }
    C3_post_C_loop#1 ( );
    P3_post_C_loop#1 ( );
}
```

Rule (4): If a select is determined to be controlled by a constant (be always true or false), the P1 and C4 probes associated with the "if" are deleted and optimization then deletes the unneeded branches. For example, in the example introduced above, if the "if" statement always evaluate to false in the B_loop, then application of this rule will result in the following modifications shown in Table 8 below:

TABLE 8

```
C1_pre_B _loop ( );
B_loop {
    C2_B_loop ( );
    P2_B_loop ( );
    C1_pre_C_loop ( );
    C_loop {
        C2_C_loop ( );
        P2_C_loop ( );
    }
    C3_post_C _loop ( );
    P3_post_C_loop ( );
}
C3_post_B _loop ( );
P3_after_B_loop ( );
```

Rule (5): Loop merging is not supported.

IV.B.5. Transaction Insertion for Pipelined Designs

When a design is pipelined, and as described above, certain embodiments of the disclosed technology add wait statements to the high-level description to break the design into many smaller transactions. The wait statements can be added, for example, by the formal verification tool itself or by another tool used to setup formal verification.

In certain embodiments, for pipelined designs, wait statements are added according to one or more of the following rules:

(1) Add a wait statement (or other such statements that create a transactional boundary) at the end of every loop (after the break, if there is a break at the end of the loop).

(2) Add a wait statement (or other such statements that create a transactional boundary) between sequential, flattened loops. If the second loop is conditional, the statement is inserted before the outermost "if", between the two loops, that contains the second loop, otherwise it is inserted immediately before the second loop.

(3) Add a wait statement (or other such statements that create a transactional boundary) before every continue statement (this is uncommon and not shown).

The example in Table 9 below shows wait insertion for pipelining at the top of the example design introduced above:

TABLE 9

```
main_loop {
    PDP_for_statics ( );
    C2_main_loop ( );
    P2_main_loop ( ); // Back edge Only
    C1_pre A_loop ( );
    A_loop {
        C2_A_loop ( );
        P2_ A_loop ( ); // Back edge Only
        if ( ) break;
        wait ( );
    }
    P1_pre_if_B_loop ( );
    wait ( );
    if ( ) {
        C1_pre B_loop ( );
        B_loop {
            C2_B_loop ( );
            P2_B_loop ( ); // Back edge Only
            P1_pre_break_C_loop ( );
            if ( ) {
                C4_ pre_ break_ C_loop ( );
                break;
            }
            C1_pre_C_loop ( );
            C_loop {
                C2_C_loop ( );
                P2_C_loop ( ); // Back edge Only
                wait ( );
            }
            wait ( );
        }
        C1_pre_D_loop ( );
        wait ( );
        D_loop {
            C2_D_loop ( );
            P2_D_loop ( ); // <<== Special case, back and forward edge
            wait ( );
        }
        C1_pre_E_loop ( );
        wait ( );
        E_loop {
            C2_E_loop ( );
            P2_E_loop ( ); // <<== Special case, back and forward edge
            wait ( );
        }
    } +21implicit else> {
        C4_else_if_B_loop ( );
        P4_else_if_B_loop ( );
    }
    wait ( );
}
```

IV.B.6. Transaction Insertion for Non-Pipelined Designs

In certain embodiments of the disclosed technology, non-pipelined designs have wait statements added to guard around every loop and to make sure every path inside the loop crosses a wait in one or more of the following instances:

(1) Before every loop;

(2) At the end of every loop (after the break);

(3) After every loop; and/or (4) Before every continue inside of a loop (this is uncommon and not shown)

The wait statements can be added, for example, by the formal verification tool itself or by another tool used to setup formal verification.

Applying this wait statement insertion rule to the example introduced above will result in the following modifications shown in Table 10 below:

TABLE 10

```
main_loop {
    PDP for statics ( );
    C2_main_loop ( );
    P2_main_loop ( );
    C1_pre_A_loop ( );
    wait ( );
    A_loop {
        C2_A_loop ( );
        P2_A_loop ( );big
        if ( ) break;
        wait ( );
    }
    wait ( );
    C3_post_A_loop ( );
    P3_post_A_loop ( );
    if ( ) {
        C1_pre_B_loop ( );
        wait ( );
        B_loop {
            C2_B_loop ( );
            P2_B_loop ( );
            if ( ) {
                break;
            }
            C1_pre_C_loop ( );
            wait ( );
            C_loop {
                C2_C_loop ( );
                P2_C_loop ( );
                wait ( );
            }
            wait ( );
            C3_post_C_loop ( );
            P3_post_C_loop ( );
            wait ( );
        }
        wait ( );
        C3_post_B_loop ( );
        P3_after_B_loop ( );
        C1_pre_D_loop ( );
        wait ( );
        D_loop {
            C2_D_loop ( );
            P2_D_loop ( );
            wait ( );
        }
        wait ( );
        C3_post_D_loop ( );
        P3_after_D_loop;
        C1_pre_E_loop ( );
        wait ( );
        E_loop {
            C2_E_loop ( );
            P2_E_loop ( );
            wait ( );
        }
        wait ( );
        C3_post_E_loop ( );
        P3_post_ E _loop ( );
    }<implicit else> {
    }
    wait ( );
}
```

IV.B.7. Wait Statements Added by HLS Tool

In some cases, the HLS tool itself inserts some wait statements that can be useful for creating transaction boundaries. For instance, the HLS tool can be configured so that it inserts selected wait statements (e.g., potentially in a different phase than wait statement insertion performed by the formal verification tool). As an example, the Catapult tool available from Calypto Design Systems inserts wait statements to the example introduced above as shown in Table 11 below:

TABLE 11

```
main_loop {
    wait ( );
    PDP for statics ( );
    C2_main_loop ( );
    P2_main_loop ( );
    C1_pre_A_loop ( );
    A_loop {
        wait ( );
        C2_A_loop ( );
        P2_A_loop ( );
        if ( ) break;
    }
    C3_post_A_loop ( );
    P3_post_A_loop ( );
    if ( ) {
        C1_pre_B_loop ( );
        B_loop {
            wait ( );
            C2_B_loop ( );
            P2_B_loop ( );
            if ( ) {
                break;
            }
            C1_pre_C_loop ( );
            C_loop {
                wait ( );
                C2_C_loop ( );
                P2_C_loop ( );
            }
            C3_post_C_loop ( );
            P3_post_C_loop ( );
        }
        C3_post_B_loop ( );
        P3_after_B _loop ( );
        C1_pre_D_loop ( );
        D_loop {
            wait ( );
            C2_D_loop ( );
            P2_D_loop ( );
        }
        C3_post_D_loop ( );
        P3_after_D_loop;
        C1_pre_E_loop ( );
        E_loop {
            wait ( );
            C2_E_loop ( );
            P2_E_loop ( );
        }
        C3_post_E_loop ( );
        P3_post_E_loop ( );
    }<implicit else>{
    }
}
```

IV.B.8. Marking Data During HLS

According to certain embodiments of the disclosed technology, it is desirable for the HLS tool to create data during the HLS process that can be used by the formal verification tool to aid in the equivalence checking process. For example, in some embodiments, it is desirable for the HLS tool to provide some information about the selects in the circuit design in order for the formal verification tool to align the probes and prove the design. In particular implementations, the HLS tool performs one or more of the following:

(1) The HLS tool tags all selects that have a constant condition and indicates which condition is selected (e.g., by storing the tags and the condition in an appropriate data structure that is accessed and used by the formal verification tool). This typically includes both true/false "if" statements and "switch" statements. In specific implementations using the Catapult HLS tool, this can be done with a "mark_select" command on the canonical name and a literal constant.

(2) The HLS tool tags all break statements that are re-phased. Such tags can be considered a type of optimization hint, as described above. Further, during formal verification and using the tags, the formal verification tool can verify that the re-phasing was appropriate. That is, the formal verification tool can use the tags to formally verify the optimizations described. In particular implementations, for example, the break re-phasing tags are treated as inductive invariants used by the formal verification tool for effective verification. Break re-phasing is discussed in more detail in the next subsection. In specific implementations using the Catapult HLS tool, this can be done with a "???" command to tag break statements using their canonical names.

IV.B.9. Break Re-Phasing

In general, there are two sources of breaks in the design: (1) Implicit breaks, which correspond to loop test expressions; and (2) Explicit breaks, which are explicitly specified in the user code. Break rephasing in some HLS tools can be done as part of the sequential optimization. It is a stand-alone transformation and can happen many times during the optimization loop implemented by the HLS tool. No differentiation may be made between implicit and explicit breaks.

In certain embodiments of the disclosed technology, the following rule is applied to perform break rephasing: during optimization, if at any point during the transformations, in a loop, if the break is a first statement and it evaluates to "0" in the first iteration and the loop does not have a continue statement, then the break is rephased.

In the user code, the break being rephased may not necessarily be the first statement in the loop but during optimizations can become the first statement as a side effect of other optimizations (e.g., if all statements inside the loop before the break is hit are unused, they can be deleted which results in explicit break becoming the first statement).

V. Concluding Remarks

Additional details concerning embodiments of the disclosed technology are described in U.S. Provisional Application No. 62/007,852 entitled "FORMAL VERIFICATION USING MICROTRANSACTIONS" and filed on Jun. 4, 2014, and of U.S. Provisional Application No. 62/042,207 entitled "FORMAL VERIFICATION USING MICROTRANSACTIONS" and filed on Aug. 26, 2014, as well as the accompanying appendices of those provisional applications, all of which are hereby incorporated herein by reference. Any one or more of the features, aspects, and/or functions described in any of the provisional applications, their accompanying appendices, or above can be used alone or in any combination or sub-combination with one another or with other synthesis or verification tools.

Having illustrated and described the principles of the disclosed technology, it will be apparent to those skilled in the art that the disclosed embodiments can be modified in arrangement and detail without departing from such principles. For example, any one or more aspects of the disclosed technology can be applied in other embodiments and environments. Additionally, the disclosed technology is not limited to RTL-level equivalence checking, but can be used to perform formal verification for and between other levels of design descriptions. In view of the many possible embodiments to which the principles of the disclosed technologies can be applied, it should be recognized that the illustrated embodiments are only preferred examples of the technology and should not be taken as limiting the scope of the invention. Rather, the scope of the invention is defined by the following claims and their equivalents. We therefore claim all that comes within the scope and spirit of these claims and their equivalents.

What is claimed is:

1. A method, comprising:
by one or more specialized electronic design automation (EDA) tools that are adapted to perform or support high-level-synthesis formal verification as part of a circuit design process and that are implemented by one or more computing devices:
inputting a high-level description of a circuit design;
inputting a register-transfer-level (RTL) description of the circuit design, the RTL description having been synthesized from the high-level description;
verifying whether the high-level description is logically equivalent to the RTL description,
wherein the verifying comprises individually verifying multiple high-level transactions specified within a single function call of the high-level description with multiple corresponding RTL transactions specified in the RTL description, thereby verifying the RTL description at a level of granularity smaller than the function-call level; and
inserting one or more transaction boundaries within the single function call, thereby creating the multiple high-level transactions specified within the single function call used during the verifying, wherein the transaction boundaries are wait statements.

2. The method of claim 1, further comprising inserting probes into the high-level description in order to capture values of variables in the high-level description at points in the high-level description that correspond to the transaction boundaries.

3. The method of claim 2, further comprising generating one or more probe maps mapping the probes in the high-level description to corresponding portions of the RTL description.

4. The method of claim 3, wherein the verifying is performed using the probe maps.

5. The method of claim 3, wherein the method further comprises inputting one or more optimization hints provided by an HLS tool that synthesized the high-level description, the optimization hints describing one or more optimizations performed by the HLS tool; and wherein the verifying comprises formally verifying the optimizations performed by the HLS tool using the optimization hints.

6. The method of claim 1, wherein the high-level description is a C++ or SystemC description of the circuit design.

7. The method of claim 1, wherein the RTL description includes one or more pipelined loops that remain pipelined and are not unrolled during the verifying.

8. The method of claim 7, wherein each iteration of the one or more pipelined loops is treated as a separate transaction during the verifying.

9. The method of claim 1, wherein the verifying is performed by a logic equivalence checking tool.

10. The method of claim 1, further comprising selectively inserting one or more statements that create delay into the high-level description.

11. The method of claim 10, wherein the selectively inserting the one or more statements that create delay is performed so that the verifying of the multiple high-level transactions specified within the single function call with the multiple corresponding RTL transactions specified in the RTL description is completed before high-level transactions and RTL transactions from a different function call are verified.

12. A computer device implementing one or more electronic design automation (EDA) tools configured to perform a method, comprising:

by one or more specialized electronic design automation (EDA) tools that are adapted to perform or support high-level-synthesis formal verification as part of a circuit design process and that are implemented by one or more computing devices:

inputting a high-level description of a circuit design;

inputting a register-transfer-level (RTL) description of the circuit design, the RTL description having been synthesized from the high-level description; and verifying whether the high-level description is logically equivalent to the RTL description, wherein the verifying comprises individually verifying multiple high-level transactions specified within a single function call of the high-level description with multiple corresponding RTL transactions specified in the RTL description, thereby verifying the RTL description at a level of granularity smaller than the function-call level; and inserting one or more transaction boundaries within the single function call, thereby creating the multiple high-level transactions specified within the single function call used during the verifying, wherein the transaction boundaries are wait statements.

13. The computer device of claim 12, wherein the method further comprises inserting probes into the high-level description in order to capture values of variables in the high-level description at points in the high-level description that correspond to the transaction boundaries.

14. The computer device of claim 13, wherein the method further comprises generating one or more probe maps mapping the probes in the high-level description to corresponding portions of the RTL description.

15. The computer device of claim 14, wherein the verifying is performed using the probe maps.

16. The computer device of claim 13, wherein the method further comprises inputting one or more optimization hints provided by an HLS tool that synthesized the high-level description, the optimization hints describing one or more optimizations performed by the HLS tool; and wherein the verifying comprises formally verifying the optimizations performed by the HLS tool using the optimization hints.

17. The computer device of claim 12, wherein the high-level description is a C++ or SystemC description of the circuit design.

18. The computer device of claim 12, wherein the RTL description includes one or more pipelined loops that remain pipelined and are not unrolled during the verifying.

19. The computer device of claim 18, wherein each iteration of the one or more pipelined loops is treated as a separate transaction during the verifying.

20. The computer device of claim 12, wherein the verifying is performed by a logic equivalence checking tool.

21. The computer device of claim 12, wherein the method further comprises selectively inserting one or more statements that create delay into the high-level description.

22. The computer device of claim 21, wherein the selectively inserting the one or more statements that create delay is performed so that the verifying of the multiple high-level transactions specified within the single function call with the multiple corresponding RTL transactions specified in the RTL description is completed before high-level transactions and RTL transactions from a different function call are verified.

23. One or more non-transitory computer-readable media storing computer-executable instructions when executed by a computer cause the computer to perform a method, comprising:

by one or more specialized electronic design automation (EDA) tools that are adapted to perform or support high-level-synthesis formal verification as part of a circuit design process and that are implemented by one or more computing devices:

inputting a high-level description of a circuit design;

inputting a register-transfer-level (RTL) description of the circuit design, the RTL description having been synthesized from the high-level description;

verifying whether the high-level description is logically equivalent to the RTL description, wherein the verifying comprises individually verifying multiple high-level transactions specified within a single function call of the high-level description with multiple corresponding RTL transactions specified in the RTL description, thereby verifying the RTL description at a level of granularity smaller than the function-call level; and selectively inserting one or more statements that create delay into the high-level description, wherein the selectively inserting the one or more statements that create delay is performed so that the verifying of the multiple high-level transactions specified within the single function call with the multiple corresponding RTL transactions specified in the RTL description is completed before high-level transactions and RTL transactions from a different function call are verified.

24. The one or more non-transitory computer-readable media of claim 23, wherein the method further comprises inserting one or more transaction boundaries within the single function call, thereby creating the multiple high-level transactions specified within the single function call used during the verifying.

25. The one or more non-transitory computer-readable media of claim 24, wherein the transaction boundaries are wait statements.

26. The one or more non-transitory computer-readable media of claim 23, wherein the method further comprises inserting probes into the high-level description in order to capture values of variables in the high-level description at points in the high-level description that correspond to the transaction boundaries.

27. The one or more non-transitory computer-readable media of claim 26, wherein the method further comprises generating one or more probe maps mapping the probes in the high-level description to corresponding portions of the RTL description.

28. The one or more non-transitory computer-readable media of claim 27, wherein the verifying is performed using the probe maps.

29. The one or more non-transitory computer-readable media of claim 27, wherein the method further comprises inputting one or more optimization hints provided by an HLS tool that synthesized the high-level description, the optimization hints describing one or more optimizations performed by the HLS tool; and wherein the verifying comprises formally verifying the optimizations performed by the HLS tool using the optimization hints.

30. The one or more non-transitory computer-readable media of claim 23, wherein the high-level description is a C++ or SystemC description of the circuit design.

31. The one or more non-transitory computer-readable media of claim 23, wherein the RTL description includes one or more pipelined loops that remain pipelined and are not unrolled during the verifying.

32. The one or more non-transitory computer-readable media of claim 31, wherein each iteration of the one or more pipelined loops is treated as a separate transaction during the verifying.

\* \* \* \* \*